(12) United States Patent
Murata et al.

(10) Patent No.: US 8,274,809 B2
(45) Date of Patent: Sep. 25, 2012

(54) SEMICONDUCTOR STORAGE DEVICE

(75) Inventors: Takeshi Murata, Kawasaki (JP);
Yutaka Ishibashi, Yokohama (JP);
Hiroyuki Nitta, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 12/855,151

(22) Filed: Aug. 12, 2010

(65) Prior Publication Data
US 2011/0038194 A1 Feb. 17, 2011

(30) Foreign Application Priority Data

Aug. 13, 2009 (JP) ................................. 2009-187826

(51) Int. Cl.
*G11C 5/02* (2006.01)
(52) U.S. Cl. .......................... 365/51; 365/63
(58) Field of Classification Search .................... 365/51, 365/63, 163
See application file for complete search history.

(56) References Cited

U.S. PATENT DOCUMENTS

| | | | |
|---|---|---|---|
| 7,208,751 B2 | 4/2007 | Ooishi | |
| 7,755,934 B2 * | 7/2010 | Toda et al. | 365/163 |
| 2008/0258129 A1 | 10/2008 | Toda | |
| 2010/0097832 A1 * | 4/2010 | Mukai et al. | 365/51 |
| 2010/0265750 A1 * | 10/2010 | Yan et al. | 365/51 |

FOREIGN PATENT DOCUMENTS

| | | |
|---|---|---|
| JP | 10-79439 | 3/1998 |
| JP | 2000-114493 | 4/2000 |
| JP | 3575988 B2 | 7/2004 |
| JP | 2004-356313 | 12/2004 |
| JP | 2005-522045 | 7/2005 |
| JP | 2008-147343 | 6/2008 |
| JP | 2008-252112 | 10/2008 |

OTHER PUBLICATIONS

Office Action issued Oct. 25, 2011, in Japanese Patent Application No. 2009-187826 (with English-language translation).

* cited by examiner

*Primary Examiner* — Vu Le
(74) *Attorney, Agent, or Firm* — Oblon, Spivak, McClelland, Maier & Neustadt, L.L.P.

(57) ABSTRACT

According to one embodiment, a semiconductor storage device includes a plurality of parallel first interconnects extending in a first direction, a plurality of parallel second interconnects which extend in a second direction perpendicular to the first direction and which make a two-level crossing with respect to the first interconnects, and memory cell structures provided in regions where the first interconnects and the second interconnects make two-level crossings, the memory cell structures being connected on one end to the first interconnects and connected on the other end to the second interconnects, the memory cell structure including a variable resistive element and a non-ohmic element which are connected in series, wherein the endmost first interconnect is disconnected in at least one portion.

17 Claims, 19 Drawing Sheets

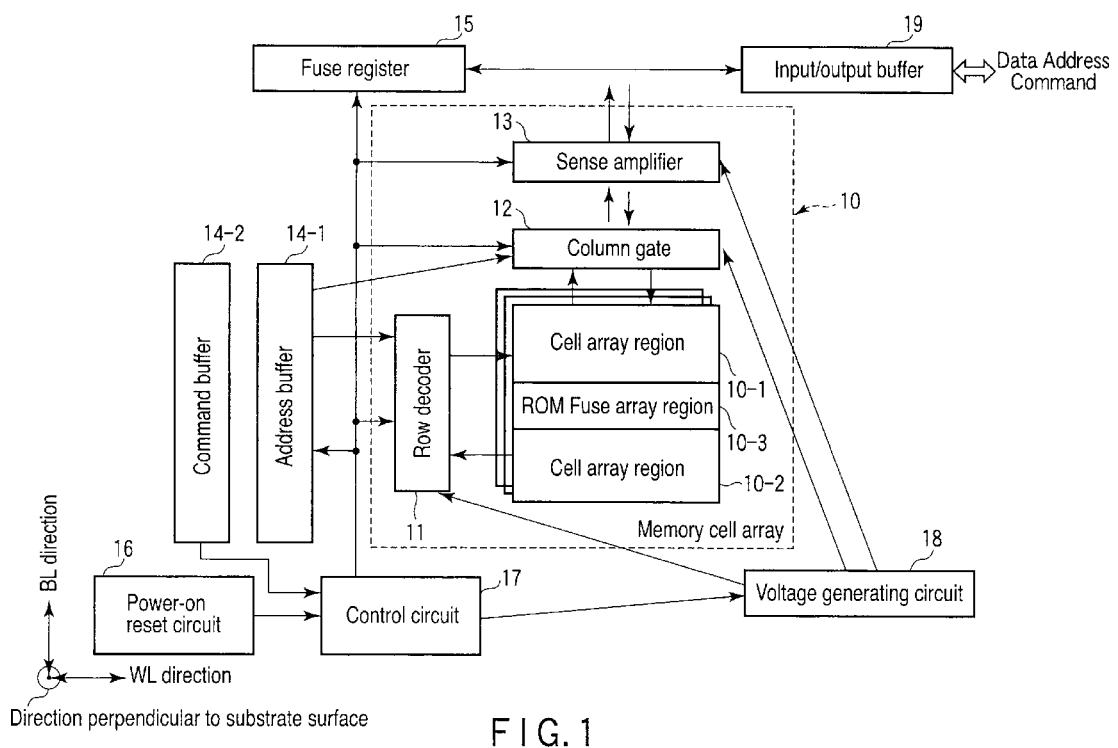
F I G. 1

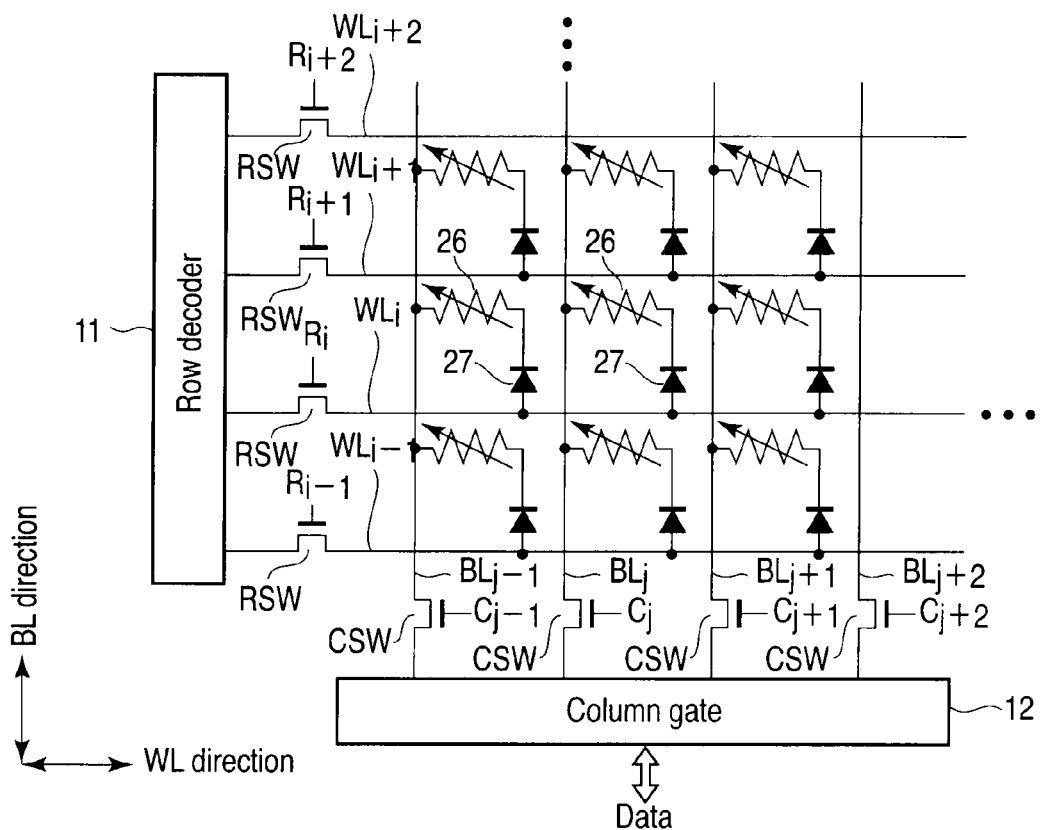
F I G. 3
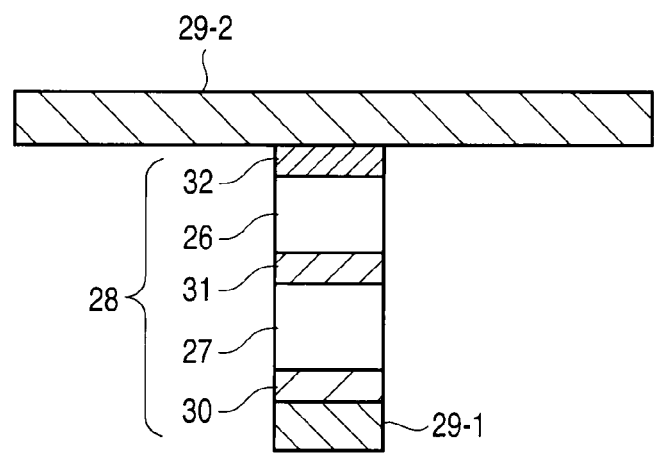
F I G. 4

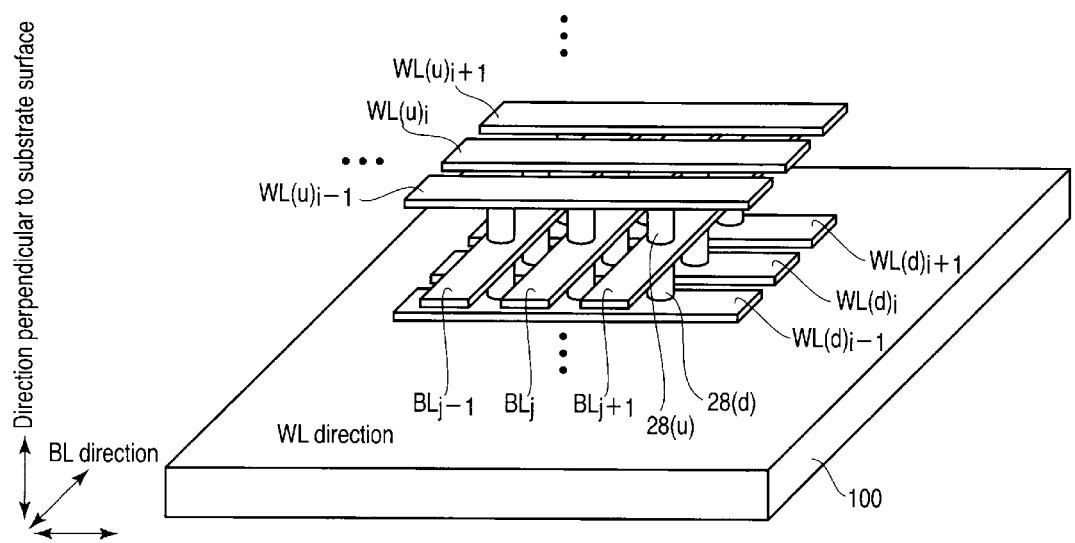
F I G. 5

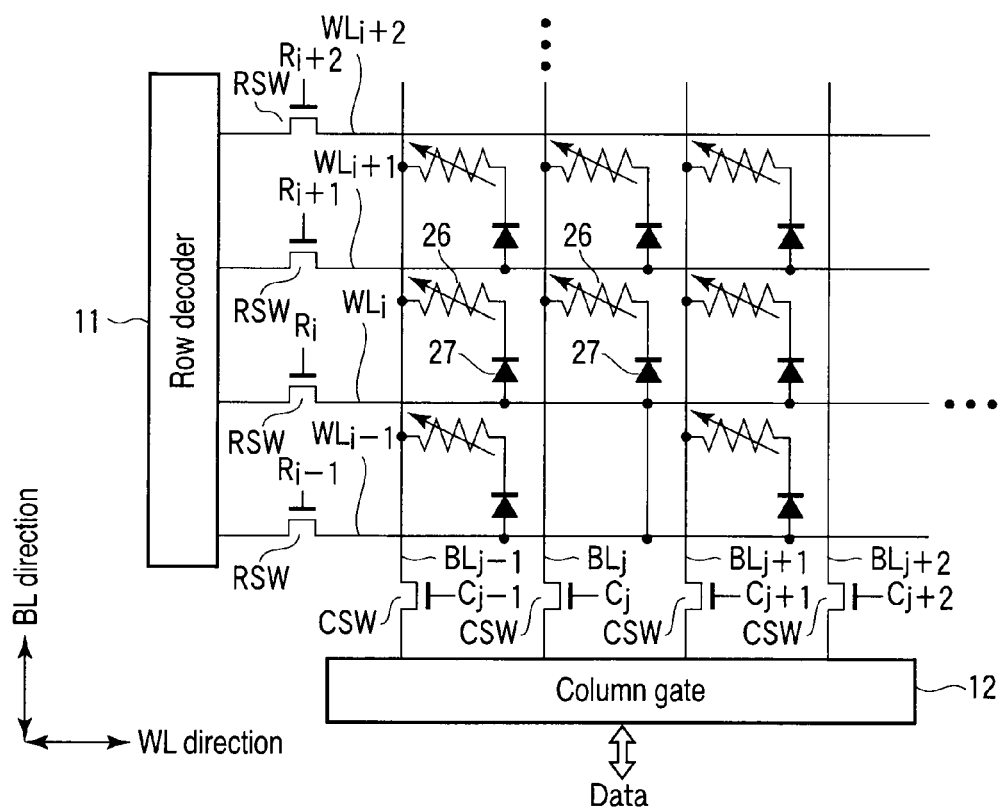
F I G. 11

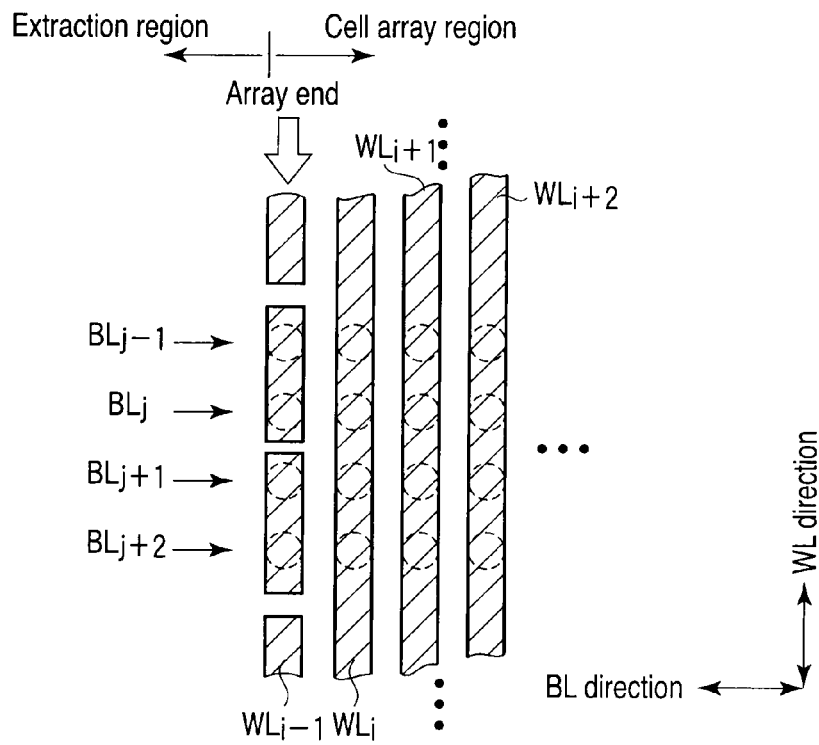
F I G. 12
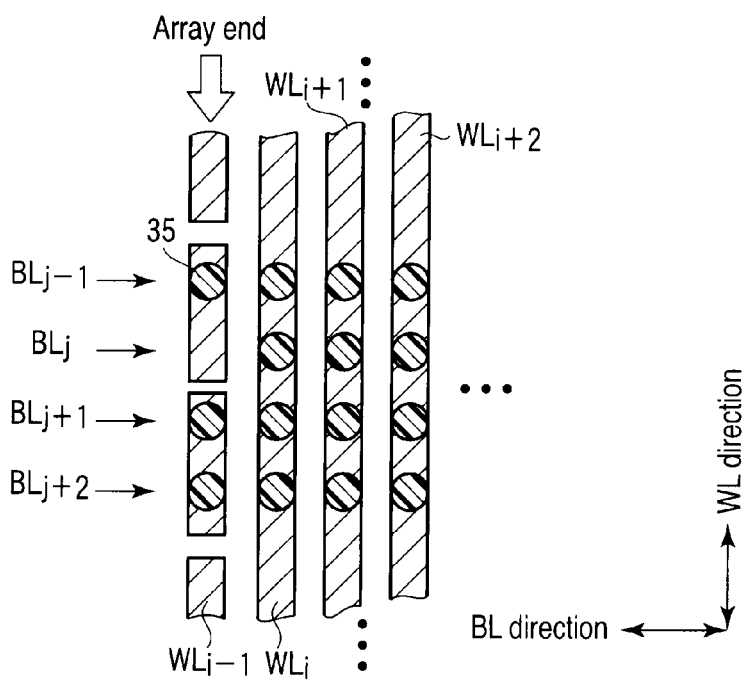
F I G. 13

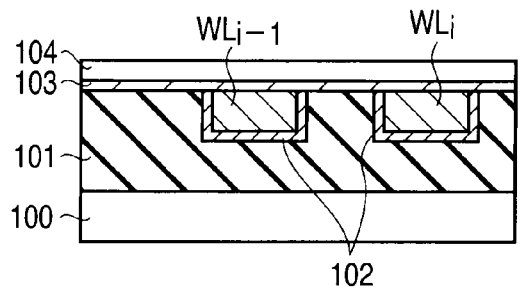
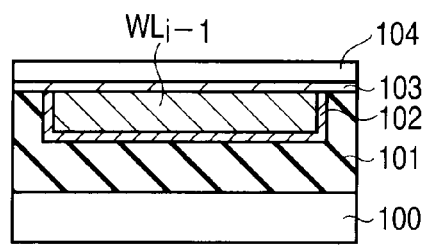
F I G. 16A      F I G. 16B
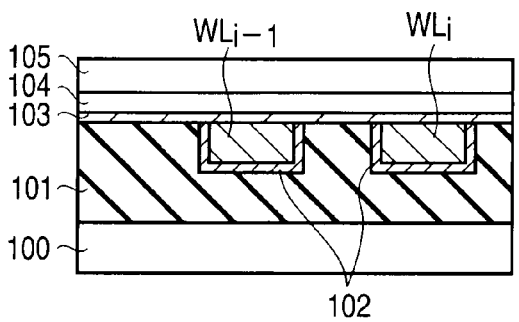
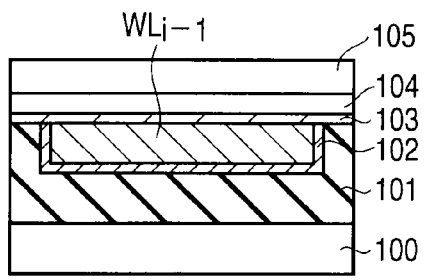
F I G. 17A      F I G. 17B
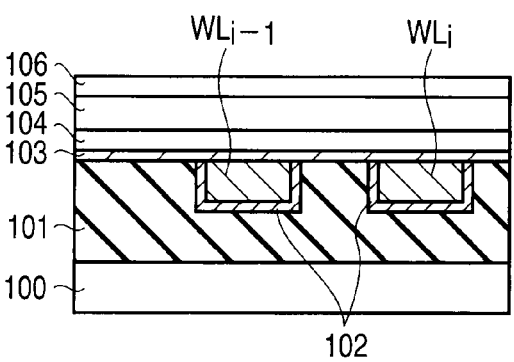
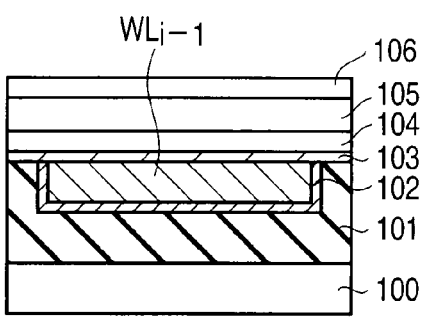
F I G. 18A      F I G. 18B

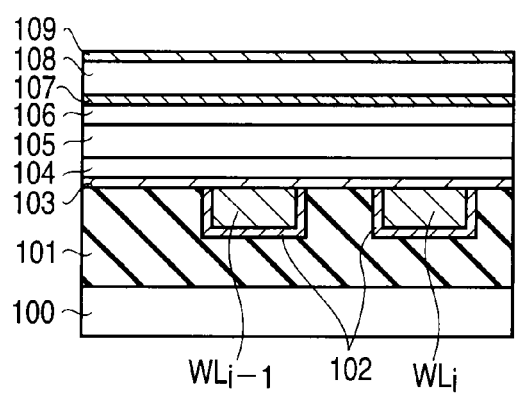
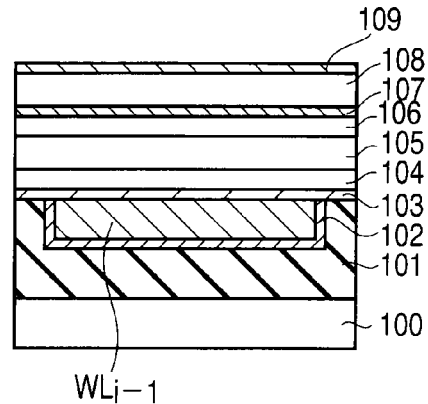
F I G. 19A
F I G. 19B
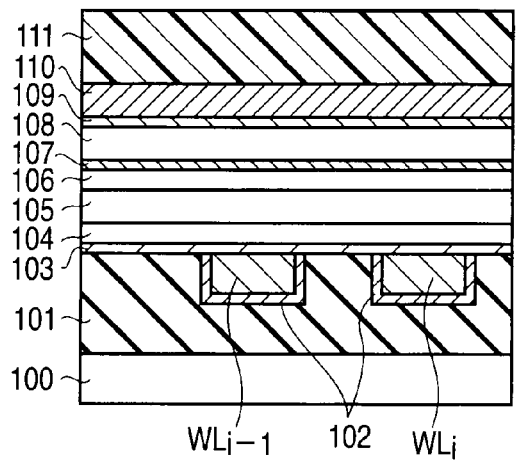
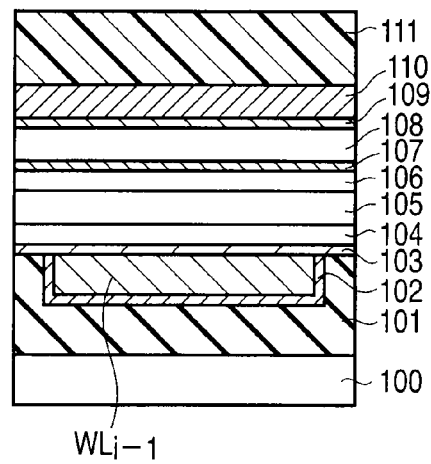
F I G. 20A
F I G. 20B

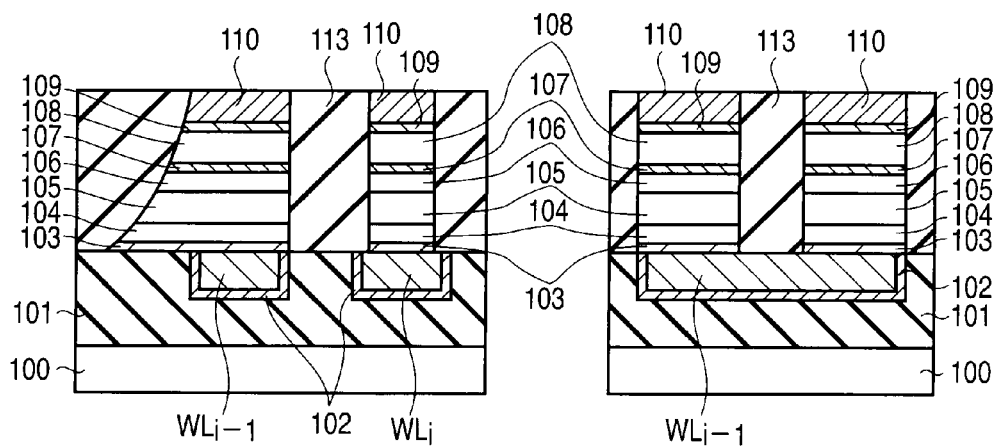
F I G. 23A    F I G. 23B
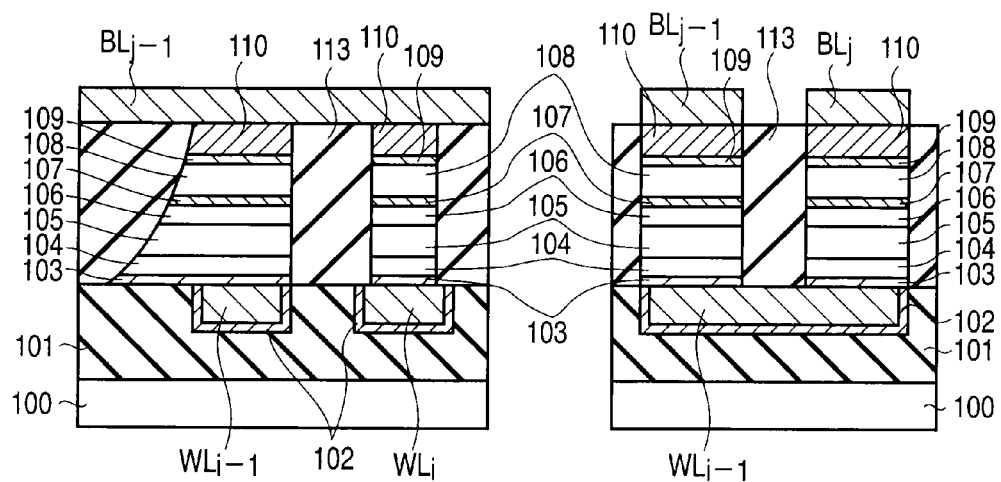
F I G. 24A    F I G. 24B

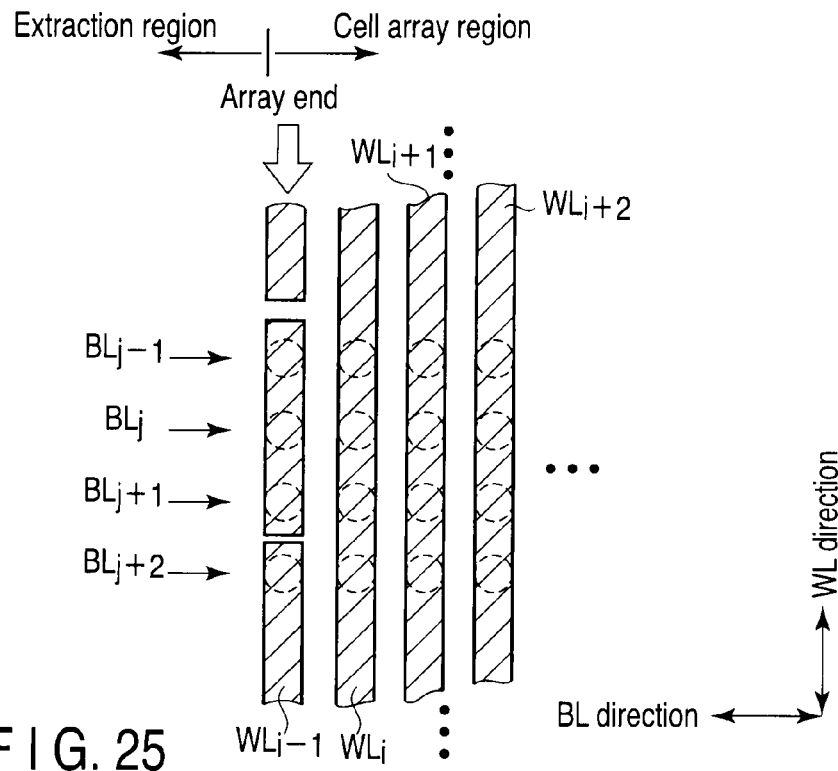
F I G. 25
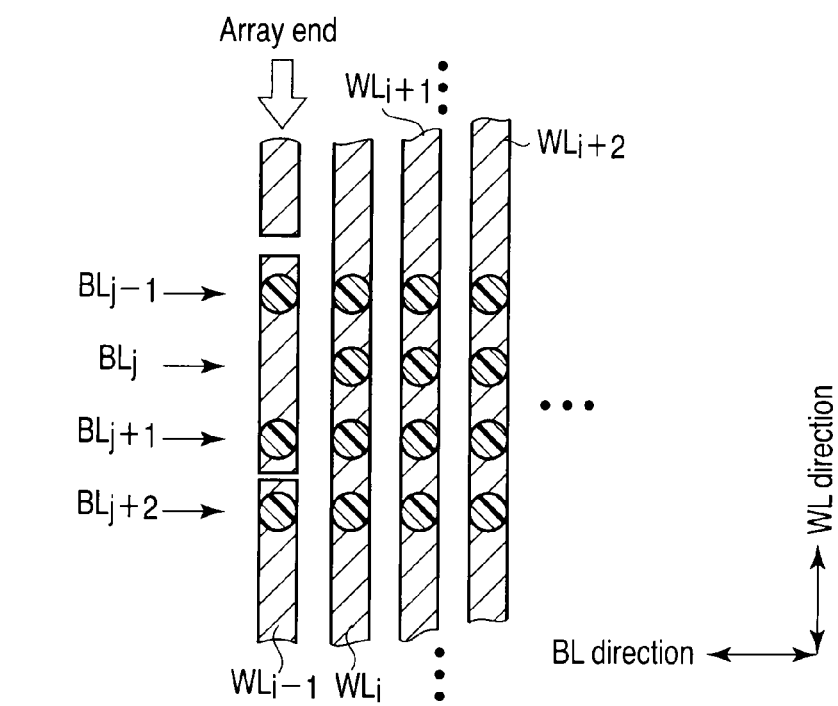
F I G. 26

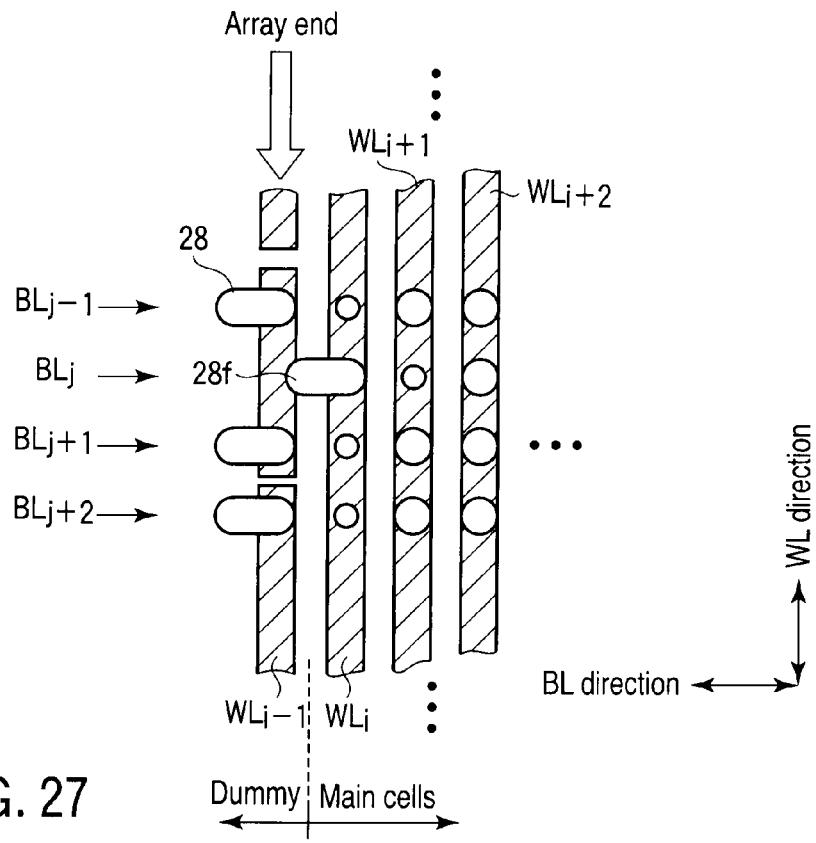
F I G. 27
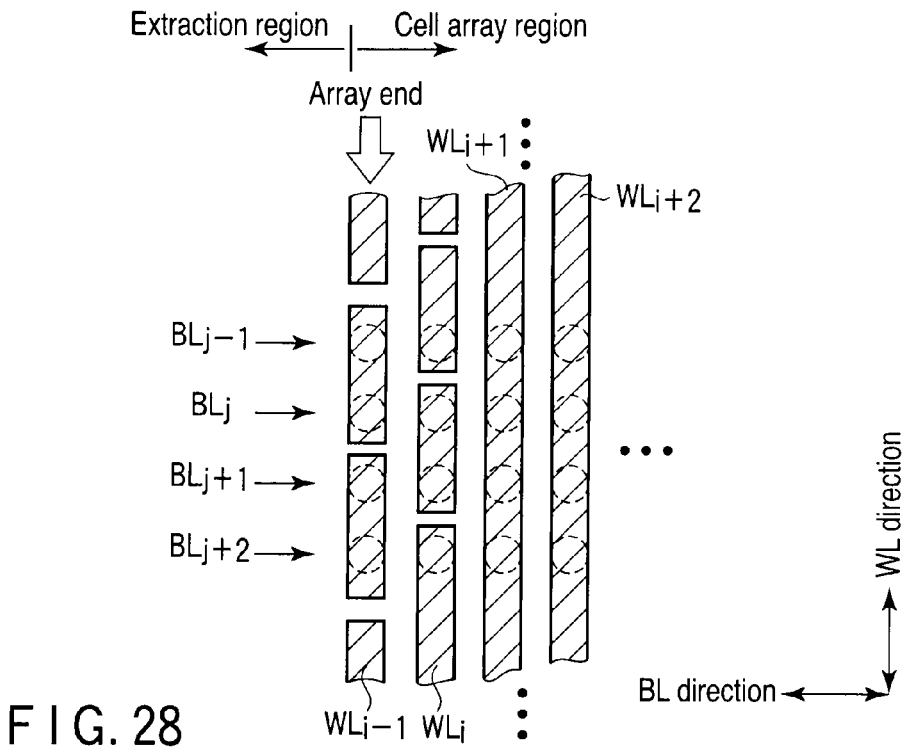
F I G. 28

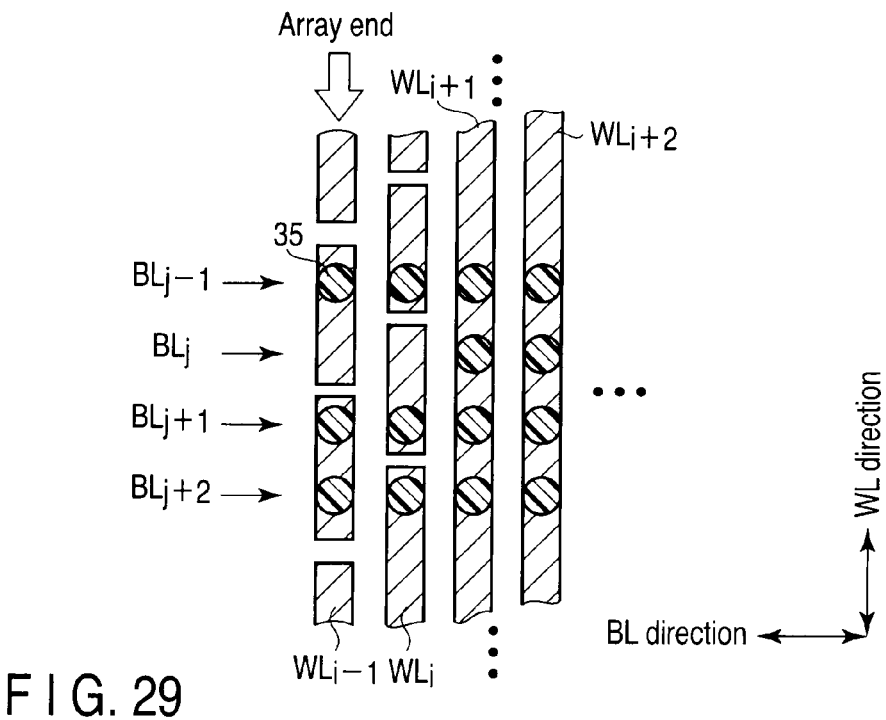
F I G. 29
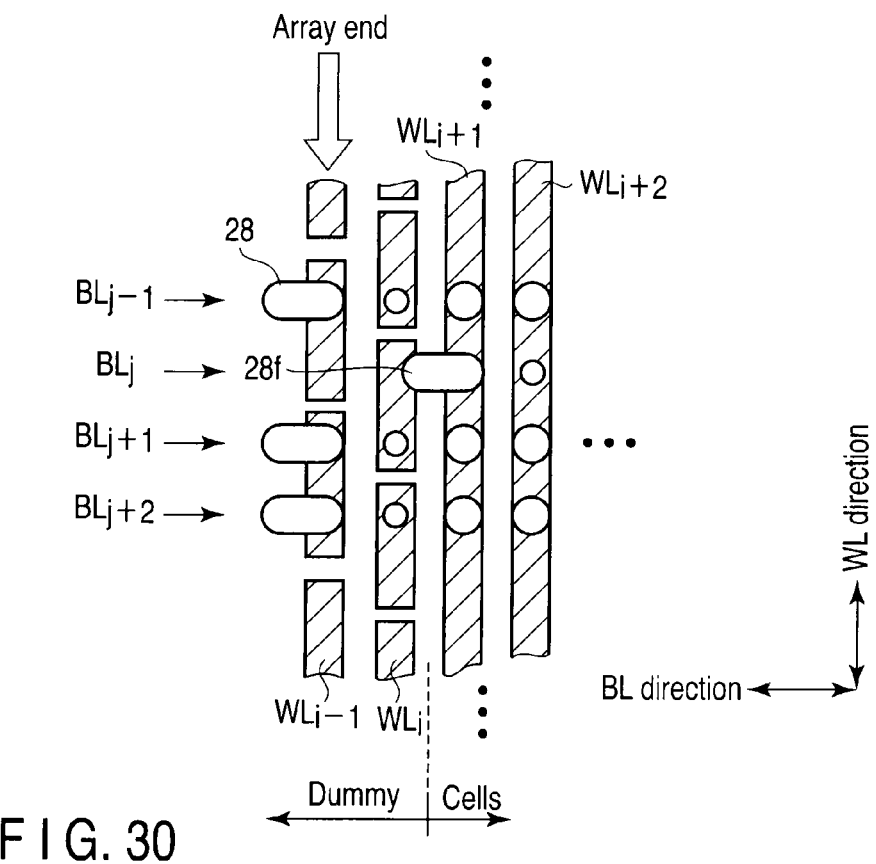
F I G. 30

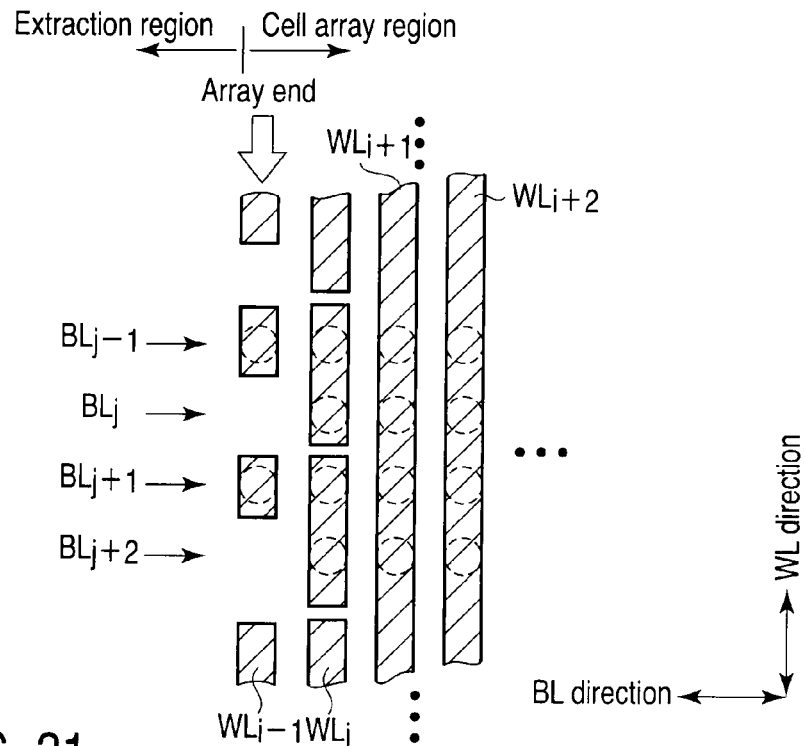
F I G. 31
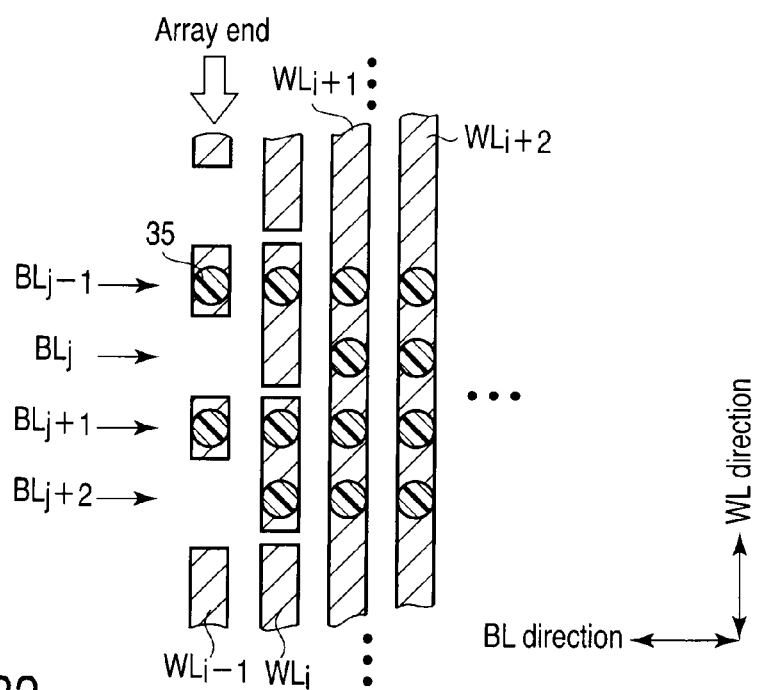
F I G. 32

SEMICONDUCTOR STORAGE DEVICE

CROSS-REFERENCE TO RELATED APPLICATIONS

This application is based upon and claims the benefit of priority from Japanese Patent Application No. 2009-187826, filed Aug. 13, 2009; the entire contents of which are incorporated herein by reference.

FIELD

Embodiments described herein relate generally to a semiconductor storage device.

BACKGROUND

Next-generation memories have been proposed, such as a ferroelectric random access memory (FeRAM), a magnetic random access memory (MRAM) and a resistance random access memory (ReRAM). In particular, one proposed ReRAM comprises a plurality of three-dimensionally structured memory cell arrays stacked on a substrate (e.g., see Jpn. Pat. Appln. KOKAI Publication No. 2005-522045). This structure has the advantage of enabling a significant reduction in chip area.

However, it is becoming increasingly difficult to precisely manufacture the above-mentioned memories according to memory miniaturization. This disadvantageously increases defective memory cells.

BRIEF DESCRIPTION OF THE DRAWINGS

FIG. 1 is a diagram schematically showing the overall configuration of a phase-change memory device according to an embodiment;

FIG. 3 is a diagram schematically showing the basic circuit configuration of a cell array according to the embodiment;

FIG. 4 is a sectional view schematically showing the basic configuration of a memory cell structure according to the embodiment;

FIG. 5 is a bird's-eye view schematically showing the basic configuration of the cell array according to the embodiment;

FIG. 11 is a diagram schematically showing the basic circuit configuration of the cell array according to the comparative example of the embodiment;

FIG. 12 is a diagram schematically showing the configuration of interconnects of a phase-change memory device according to a first embodiment;

FIG. 13 is a diagram schematically showing part of a pattern transfer process using the structure of FIG. 12;

FIG. 16A is a sectional view along the bit line direction schematically showing the basic method of manufacturing the phase-change memory device according to the first embodiment, and FIG. 16B is a sectional view along the word line direction schematically showing the basic method of manufacturing the phase-change memory device according to the first embodiment;

FIG. 17A is a sectional view along the bit line direction schematically showing the basic method of manufacturing the phase-change memory device according to the first embodiment, and FIG. 17B is a sectional view along the word line direction schematically showing the basic method of manufacturing the phase-change memory device according to the first embodiment;

FIG. 18A is a sectional view along the bit line direction schematically showing the basic method of manufacturing the phase-change memory device according to the first embodiment, and FIG. 18B is a sectional view along the word line direction schematically showing the basic method of manufacturing the phase-change memory device according to the first embodiment;

FIG. 19A is a sectional view along the bit line direction schematically showing the basic method of manufacturing the phase-change memory device according to the first embodiment, and FIG. 19B is a sectional view along the word line direction schematically showing the basic method of manufacturing the phase-change memory device according to the first embodiment;

FIG. 20A is a sectional view along the bit line direction schematically showing the basic method of manufacturing the phase-change memory device according to the first embodiment, and FIG. 20B is a sectional view along the word line direction schematically showing the basic method of manufacturing the phase-change memory device according to the first embodiment;

FIG. 23A is a sectional view along the bit line direction schematically showing the basic method of manufacturing the phase-change memory device according to the first embodiment, and FIG. 23B is a sectional view along the word line direction schematically showing the basic method of manufacturing the phase-change memory device according to the first embodiment;

FIG. 24A is a sectional view along the bit line direction schematically showing the basic method of manufacturing the phase-change memory device according to the first embodiment, and FIG. 24B is a sectional view along the word line direction schematically showing the basic method of manufacturing the phase-change memory device according to the first embodiment;

FIG. 25 is a diagram schematically showing the configuration of interconnects of a phase-change memory device according to a second embodiment;

FIG. 26 is a diagram schematically showing part of a pattern transfer process using the structure of FIG. 25;

FIG. 27 is a diagram schematically showing part of the pattern transfer process using the structure of FIG. 25;

FIG. 28 is a diagram schematically showing the configuration of interconnects of a phase-change memory device according to a third embodiment;

FIG. 29 is a diagram schematically showing part of a pattern transfer process using the structure of FIG. 28;

FIG. 30 is a diagram schematically showing part of the pattern transfer process using the structure of FIG. 28;

FIG. 31 is a diagram schematically showing the configuration of interconnects of a phase-change memory device according to a fourth embodiment;

FIG. 32 is a diagram schematically showing part of a pattern transfer process using the structure of FIG. 31.

DETAILED DESCRIPTION

Figure 2:
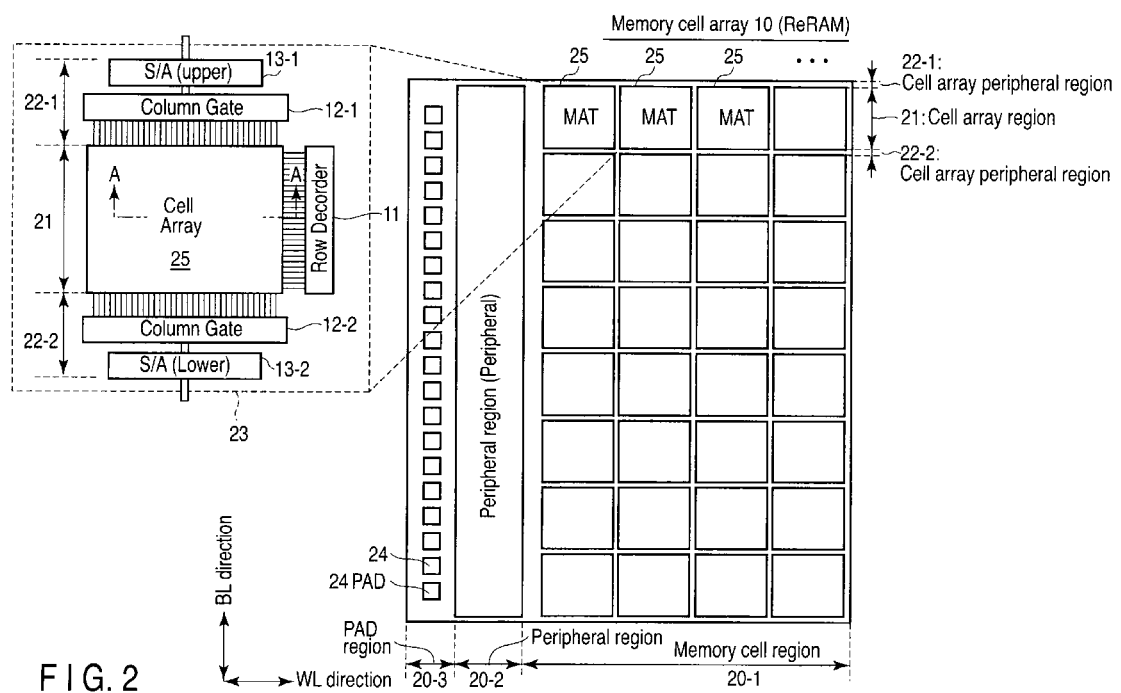
FIG. 2 is a diagram schematically showing the basic configuration of the phase-change memory device according to the embodiment.

In general, according to one embodiment, a semiconductor storage device comprising: a plurality of parallel first interconnects extending in a first direction; a plurality of parallel second interconnects which extend in a second direction perpendicular to the first direction and which make a two-level crossing with respect to the first interconnects; and memory cell structures provided in regions where the first interconnects and the second interconnects make two-level crossings, the memory cell structures being connected on one end to the first interconnects and connected on the other end to the second interconnects, the memory cell structure including a variable resistive element and a non-ohmic element which are connected in series; wherein the endmost first interconnect is disconnected in at least one portion.

Embodiments will be described below in detail with reference to the drawings.

First Embodiment

A phase-change memory device is described as one example of a semiconductor device according to an embodiment. FIGS. 1, 2, 3, 4, 5 and 6 are diagrams illustrating the basic configuration of the semiconductor device according to the embodiment.

FIG. 1 is a diagram schematically showing the overall configuration of the phase-change memory device according to the embodiment.

As shown in FIG. 1, the phase-change memory device according to the present embodiment comprises a memory cell array 10, a row decoder 11, a column gate 12, a sense amplifier 13, an address buffer 14-1, a command buffer 14-2, a fuse register 15, a power-on reset circuit 16, a control circuit 17, a voltage generating circuit 18 and an input/output buffer 19.

The memory cell array 10 includes memory cell array regions 10-1, 10-2 and a ROM fuse array region 10-3. Each of these regions has a plurality of ReRAM memory cells which are arranged in matrix form at the intersections of a plurality of word lines (WL) and bit lines (BL) and which are randomly accessed. Moreover, the memory cell array 10 has a three-dimensional structure in which a plurality of memory cell arrays are stacked perpendicularly to the surface of a semiconductor substrate as described later.

The row decoder 11 decodes an address in a row direction (word line direction). The row decoder 11 has a drive circuit for driving word lines.

The column gate 12 decodes an address in a column direction (bit line direction). The column gate 12 has a drive circuit for driving bit lines. Although not shown here, the column gates 12 are arranged, in the present embodiment, on the upper side and lower side of the memory cell array 10 as described later.

The sense amplifier 13 is electrically connected to the column gate 12 and the bit lines, and reads data in a memory cell. Although not shown here, the sense amplifiers 13 are arranged, in the present embodiment, on the upper side and lower side of the memory cell array 10. There are more than one times as many sense amplifiers 13 as the number of bits of I/O pins 0 to 7 described later.

The address buffer 14-1 is electrically connected to the row decoder 11 and the column gate 12, and temporarily retains a row address and a column address.

The command buffer 14-2 is electrically connected to the control circuit 17, and temporarily retains a control command.

The fuse register 15 is electrically connected to the input/output buffer 19 via a data bus line, and retains necessary data such as management data.

The power-on reset circuit 16 detects power-on of this device, and outputs a reset signal to the control circuit 17.

The voltage generating circuit 18 is electrically connected to the row decoder 11, the column gate 12 and the sense amplifier 13, and supplies voltages necessary for these circuits under the control of the control circuit 17.

The input/output buffer 19 is electrically connected to the sense amplifier 13 and the fuse register 15 via a data but line, and temporarily retains data, an address and a command from an external such as a host device.

The control circuit 17 controls the above-mentioned circuits. For example, the control circuit 17 controls the above-mentioned circuits to write, read or erase data.

Now, the configuration of the memory cell array 10 according to the embodiment is described with FIG. 2.

FIG. 2 is a diagram schematically showing the basic configuration of the phase-change memory device according to the embodiment.

As shown in FIG. 2, the memory cell array 10 comprises a memory cell region 20-1, a peripheral region 20-2 and a PAD region 20-3. The memory cell region 20-1 includes a region 23 including a MAT, a cell array region 21 and cell array peripheral regions 22-1, 22-2. A plurality of PADs 24 are arranged in the PAD region 20-3.

The region 23 has a cell array 25, column gates 12-1, 12-2, sense amplifiers 13-1, 13-2, and the row decoder 11. The cell array 25 has a plurality of memory cells. These memory cells are arranged in the cell array region 21 in matrix form at the intersections of the plurality of word lines and bit lines, and are randomly accessed. The column gate 12-1 is disposed on the upper surface of the cell array 25 in the cell array peripheral region 22-1. The column gate 12-2 is disposed on the lower surface of the cell array 25 in the cell array peripheral region 22-2. The sense amplifier 13-1 is disposed on the upper surface of the column gate 12-1 in the cell array peripheral region 22-1. The sense amplifier 13-2 is disposed on the lower surface of the column gate 12-2 in the cell array peripheral region 22-2. In addition, the column gate 12-1, 12-2 and the sense amplifier 13-1, 13-2 can be formed on only one side. Moreover, the row decoder 11 is disposed beside the cell array 25 in the cell array region 21.

The PADs 24 include, for example, I/O pads 0 to 7 to which addresses and commands are input, and control pads such as /CE pads to which a chip enable signal is input.

In addition, an extraction region (not shown) is provided around the cell array 25.

Now, the basic circuit configuration and an operation example of the cell array region and others according to the embodiment are described with FIG. 3.

FIG. 3 is a diagram schematically showing the basic circuit configuration of the cell array region and others according to the embodiment.

As shown in FIG. 3, the cell array has a plurality of memory cells (variable resistive elements) 26 and diodes (non-ohmic elements) 27. The variable resistive element 26 and the diodes 27 are arranged in matrix form at the intersections of a plurality of bit lines BLj−1 to BLj+1 and word lines WLi−1 to WLi+1, and are randomly accessed. The variable resistive elements 26 are connected on one end to bit lines BLj−1 to BLj+1 and connected on the other end to the cathodes of the diodes 27. The anodes of the diodes 27 are connected to word lines WLi−1 to WLi+1.

Bit lines BLj−1 to BLj+1 are electrically connected on one end to the column gate 12 via MOS transistors CSW as selecting switches. Word lines WLi−1 to WLi+1 are connected on one end to the row decoder 11 via MOS transistors RSW as selecting switches.

Selection signals Ci−1, Ci, Ci+1 for selecting one bit line (column) are input to the gates of the MOS transistors CSW. Selection signals Ri−1, Ri, Ri+1 for selecting one word line (row) are input to the gates of the MOS transistors RSW.

Now, a write operation of the memory cell 26 is roughly described.

To write data, a voltage may be applied to a selected variable resistive element 26, and a potential gradient may be generated in the selected variable resistive element 26 to pass a current. For example, a condition is created where the potential of word line WLi is relatively higher than the potential of bit line BLj. If word line WLi is set at, for example, a fixed potential of about 3 V, a ground potential may be provided to bit line BLj.

In this write operation, the unselected word lines WLi−1 to WLi+1 and bit lines BLj−1 to BLj+1 are preferably biased at the same potential. During standby before the write operation, all of word lines WLi−1, WLi, WLi+1 and all of bit lines BLj−1, BLj, BLj+1 are preferably precharged.

Now, a read operation of the memory cell (variable resistive element) 26 is roughly described.

To perform the read operation, for example, a voltage pulse is applied to a selected variable resistive element 26, and a current determined by the resistance of the variable resistive element 26 is detected. Here, the amplitude of this voltage pulse is desirably low to such a degree that materials constituting the variable resistive element 26 do not change in state.

For example, a read voltage is applied to a selected memory cell from bit line BLj, and the current is then measured by the sense amplifier.

Now, an erase operation (reset operation) of the memory cell 26 is roughly described.

To perform the erase operation, a selected variable resistive element 26 is Joule-heated by a high current pulse, and an oxidation-reduction reaction in this variable resistive element 26 is thereby accelerated.

Now, an example of the configuration of the memory cell structure including the memory cell 26 according to the embodiment is described with FIG. 4.

FIG. 4 is a sectional view schematically showing the basic configuration of the memory cell structure including the memory cell 26 according to the embodiment.

As shown in FIG. 4, a memory cell structure 28 in which the variable resistive element (memory cell) 26 functioning as a storage layer (resistance-change layer) and the diode 27 are stacked is formed between bit line BLj and word line WLi. More specifically, the memory cell structure 28 is in the form of a pillar, and comprises a barrier metal layer (adhesive layer) 30 formed on an interconnect 29-1, the non-ohmic element (diode) 27 formed on the barrier metal layer 30, a lower electrode 31 formed on the diode 27, the variable resistive element (memory cell) 26 formed on the lower electrode 31, and an upper electrode (buffer layer) 32 between the variable resistive element 26 and an interconnect 29-2.

The interconnects 29-1, 29-2 are word line WLi and bit line BLj, or bit line BLj and word line WLi. A heat-resistant and low-resistance material is chiefly used for the interconnects 29-1, 29-2. Such materials specifically include, for example, W, WSi, NiSi and CoSi.

The barrier metal layer 30 is made of, for example, a barrier metal such as Ti or TiN.

The non-ohmic element 27 is formed by a PIN diode. However, the PIN diode is not exclusively used, and various diodes such as a PN junction diode and a Schottky diode, a metal-insulator-metal (MIM) structure and a silicon-insulator-silicon (SIS) structure can be used.

The lower electrode 31 and the upper electrode 32 are made of a barrier metal such as Pt, Au, Ag, TiAlN, SrRuO, Ru, RuN, Ir, Co, Ti, TiN, TaN, LaNiO, Al, PtIrOx, PtRhOx, Rh or TaAlN.

The variable resistive element 26 is made of a metal oxide film such as HfO, NiO or MnO.

The positions of the variable resistive element 26 and the diode 27 may be interchanged.

Furthermore, a contact layer may be formed between the upper electrode 32 and the interconnect 29-2.

Now, an example of the three-dimensional configuration of the cell array according to the embodiment is roughly described with FIG. 5.

FIG. 5 is a bird's-eye view schematically showing the basic configuration of the cell array according to the embodiment.

The cell array is a cross-point type cell array. The cross-point structure means a structure in which a cell structure is formed at the intersection of a parallel interconnect and another interconnect that makes a two-level crossing with respect to the former interconnect. In the present embodiment, a plurality of such structures are stacked.

As shown in FIG. 5, a plurality of memory cell structures 28 are stacked perpendicularly to the surface of a semiconductor substrate 100. More specifically, an insulating film layer is present on the semiconductor substrate 100, on which the word lines (WLi−1(d), WLi(d), WLi+1(d)) and the bit lines (BLj−1, BLj, BLj+1) are present. At the intersections, memory cell structures 28(d) are arranged. Further, at the intersections of the word lines (WLi−1(u), WLi(u), WLi+1 (u)) and the bit lines (BLj−1, BLj, BLj+1), second-layer memory cell structures 28(u) are arranged. Although two layers of the memory cell structures 28 are stacked in FIG. 5, three, four or more layers of the memory cell structures 28 may be stacked.

Although not shown, select transistors for selecting a plurality of memory cell arrays and resistive elements are formed in the surface region of the semiconductor substrate 100 under the memory cell structures (memory cell structures 28(d), memory cell structures 28(u), . . . ).

Figure 6:
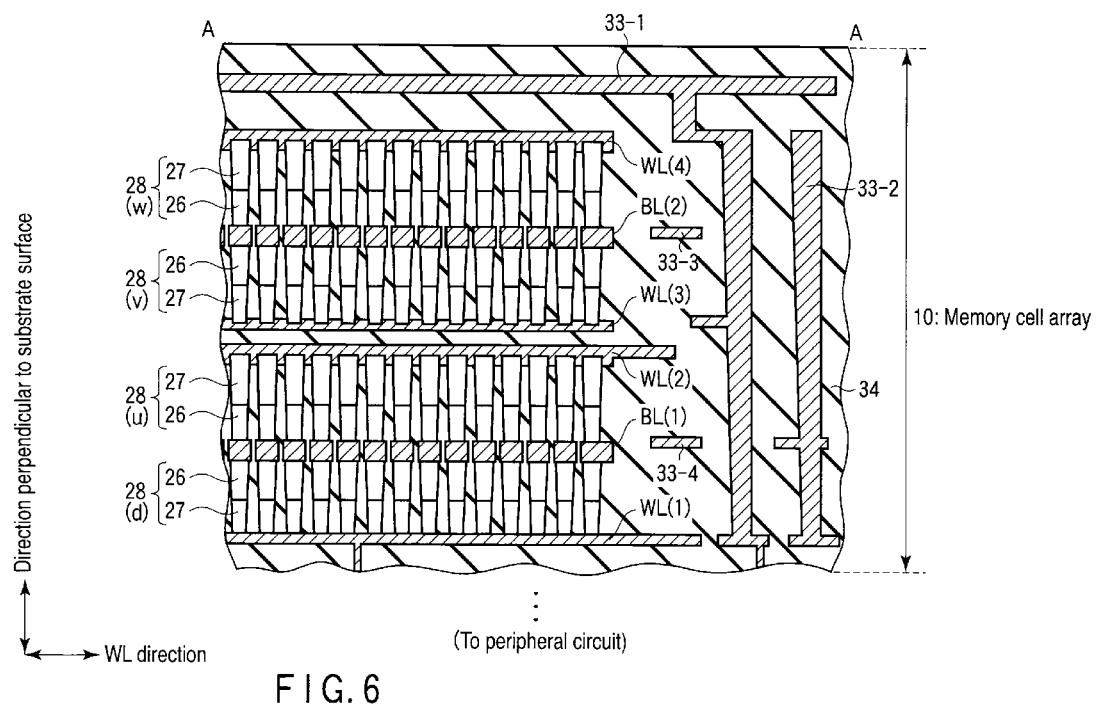
FIG. 6 is a sectional view of a memory cell array taken along line A-A of FIG. 2.

Now, the basic configuration of the memory cell array 10 according to the embodiment is described with FIG. 6.

FIG. 6 is a sectional view of the memory cell array 10 taken along line A-A of FIG. 2.

As shown in FIG. 6, the memory cell array 10 comprises the plurality of memory cell structures 28 three-dimensionally arranged on the upper side of a peripheral circuit (not shown) in the direction perpendicular to the substrate surface. The plurality of memory cell structures 28 are arranged in matrix form at the intersections of the word lines and the bit lines. In the present embodiment, four layers of memory cell structures 28 are three-dimensionally arranged. For example, memory cell structure 28(d) is disposed at the intersection of word line WL(1) and bit line BL(1), memory cell structure 28(u) is disposed at the intersection of word line WL(2) and bit line BL(1), memory cell structure 28(v) is disposed at the intersection of word line WL(3) and bit line BL(2), and memory cell structure 28(w) is disposed at the intersection of word line WL(4) and bit line BL(2).

As described above, each of the memory cell structures 28 has a stack structure of the variable resistive element 26 and the diode 27. The variable resistive elements 26 and the diodes 27 of memory cell structures 28(d), 28(u) are mirror images of each other across the shared bit line BL(1). The variable resistive elements 26 and the diodes 27 of memory cell structures 28(v), 28(w) are also mirror images of each other across the shared bit line BL(2).

Interconnects 33-1 to 33-4 are arranged in an interlayer insulating film 34, and electrically connect the memory cell array 10 to the peripheral region and others.

Now, a comparative example of the embodiment is described with FIGS. 7, 8, 9, 10 and 11. In this comparative example, the formation of the memory cell structure 28 located in the vicinity of the end of the cell array is described in particular.

Figure 7:
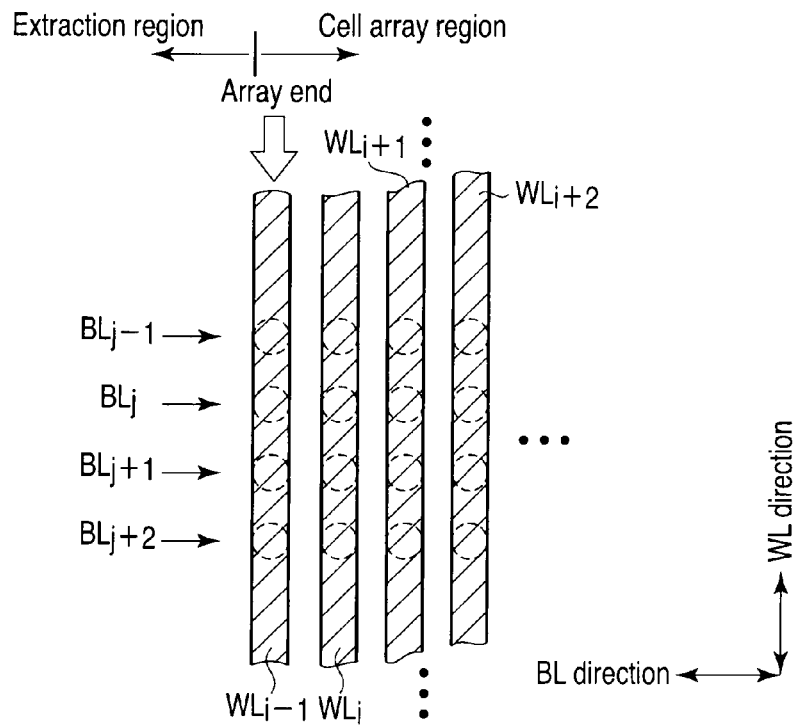
FIG. 7 is a diagram schematically showing the configuration of interconnects of a phase-change memory device according to a comparative example of the embodiment.
Figure 8:
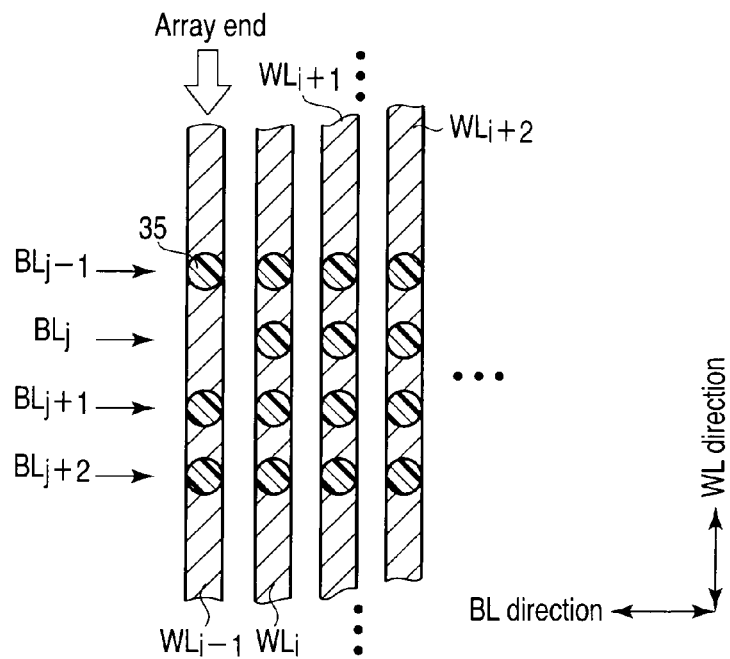
FIG. 8 is a diagram schematically showing part of a pattern transfer process using the structure of FIG. 7.
Figure 9:
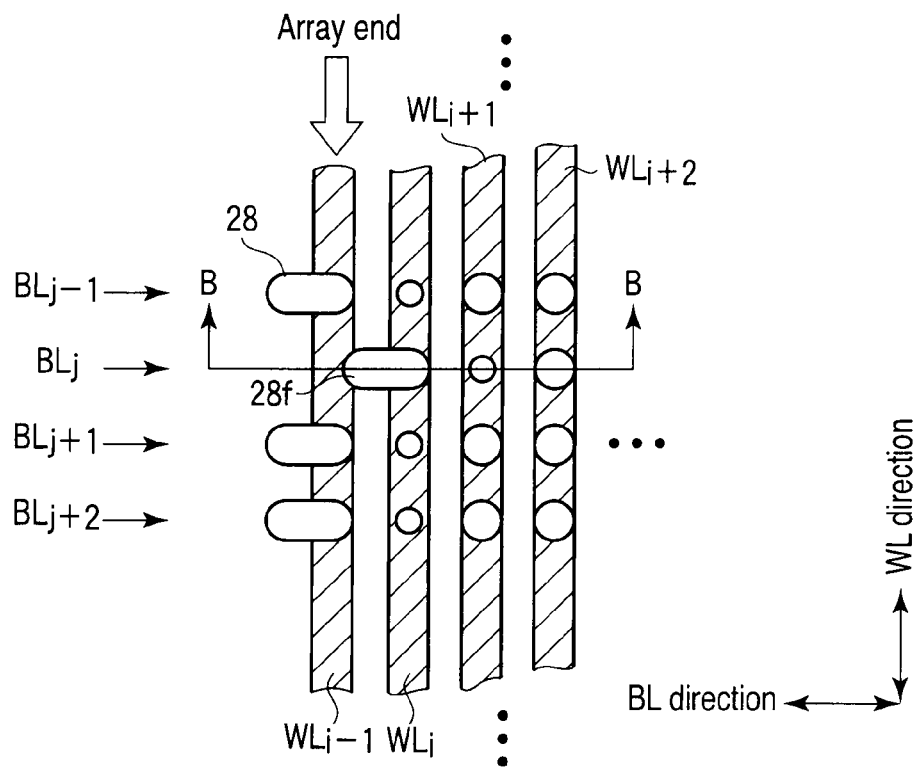
FIG. 9 is a diagram schematically showing part of a pattern transfer process using the structure of FIG. 7.
Figure 10:
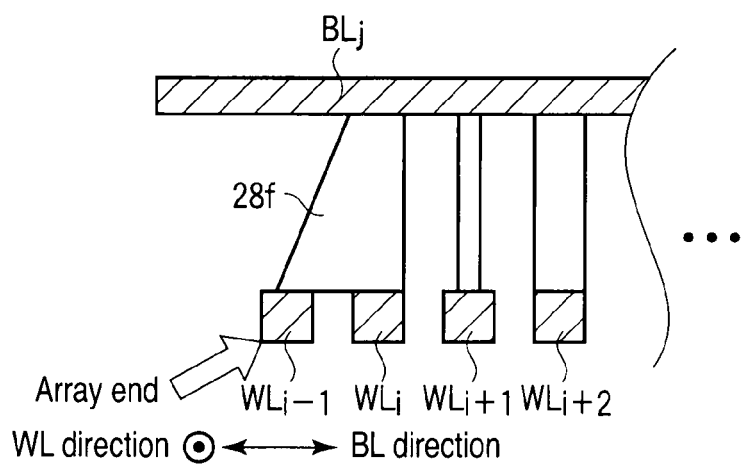
FIG. 10 is a sectional view of a cell array taken along line B-B of FIG. 9.

FIG. 7 is a diagram schematically showing the configuration of the interconnects of the phase-change memory device according to the comparative example of the embodiment. FIGS. 8 and 9 are diagrams schematically showing part of a pattern transfer process using the structure of FIG. 7. FIG. 10 is a sectional view of a cell array taken along line B-B of FIG. 9. FIG. 11 is a diagram schematically showing the basic circuit configuration of the cell array according to the first comparative example of the embodiment.

Ideally, as shown in FIG. 7, the memory cell structures 28 are formed by a lithography process, for example, at the intersections (broken line portions in the diagram) of the word lines (WLi−1, WLi, WLi+1, WLi+2) and the bit lines (BLj−1, BLj, BLj+1, BLj+2) as shown in FIG. 5. In addition, an extraction region for connecting via contacts to the word lines and the bit lines is provided in a region around the cell array, and no memory cell structure is formed in this region.

Now, problems of this comparative example are described. As shown in FIG. 8, the lithography process is carried out to form resist patterns 35 for forming the memory cell structures 28. When the memory cells are formed by a micropattern, the resist pattern 35 (a circle in the diagram) may not be formed at a designed place (e.g., the intersection of word line WLi−1 and bit line BLj) because of, for example, underexposure in the lithography process, variability of pattern dimension on the photomask, or resist collapse after the resist formation.

Furthermore, a great process conversion difference is made between the inside and ends of the cell array during the processing of the memory cell structures 28. As shown in FIG. 9, the memory cell structures 28 on outermost (array endmost) word line WLi−1 is adjacent to a sparse region (extraction region) where micropatterns are not formed as in the cell array. Reactive ion etching (RIE) for forming the memory cell structures 28 is carried out so that reaction products originating from the etching are stuck to protect the sidewall of a structure to be formed. Here, a lot of reaction products is generated on the sidewalls of the outermost memory cell structures 28 by the RIE. In contrast, patterns are dense in the inner sidewall of the cell array, and only a few reaction products stick thereto. Thus, the outermost memory cell structures 28 extend toward the extraction region in lower parts. Moreover, the memory cell structure 28 adjacent to the outermost memory cell structure 28 (memory cell structure 28 adjacent to the extraction region) in, for example, the bit line direction is reduced in diameter.

Therefore, If memory cell structure 28 is not formed at a designed place (e.g., the intersection of word line WLi−1 and bit line BLj), a memory cell structure 28f formed on the adjacent word line WLi extends in an extraction region direction. As shown in FIGS. 9 and 10, memory cell structure 28f then comes in contact with word line WLi−1.

Therefore, as shown in FIG. 11, memory cell structure 28f formed at the intersection of word line WLi and bit line BLj is electrically connected to word line WLi−1. As a result, word line WLi−1 and word line WLi cause a short circuit, and an operation failure may occur. Specifically, if the row decoder 11 and the column gate 12 select memory cell structure 28f, a voltage is supplied to all the bit lines BL via memory cell structure 28f. Thus, all the memory cell structures on word line WLi may not function normally. The same may also occur when the row decoder 11 and the column gate 12 select the memory cell structure 28 formed at the intersection of word line WLi−1 and bit line BLj. This operation failure occurs even when the WLi+1 is a dummy word line, and also occurs even when the dummy word line is in a floating state.

Figure 14:
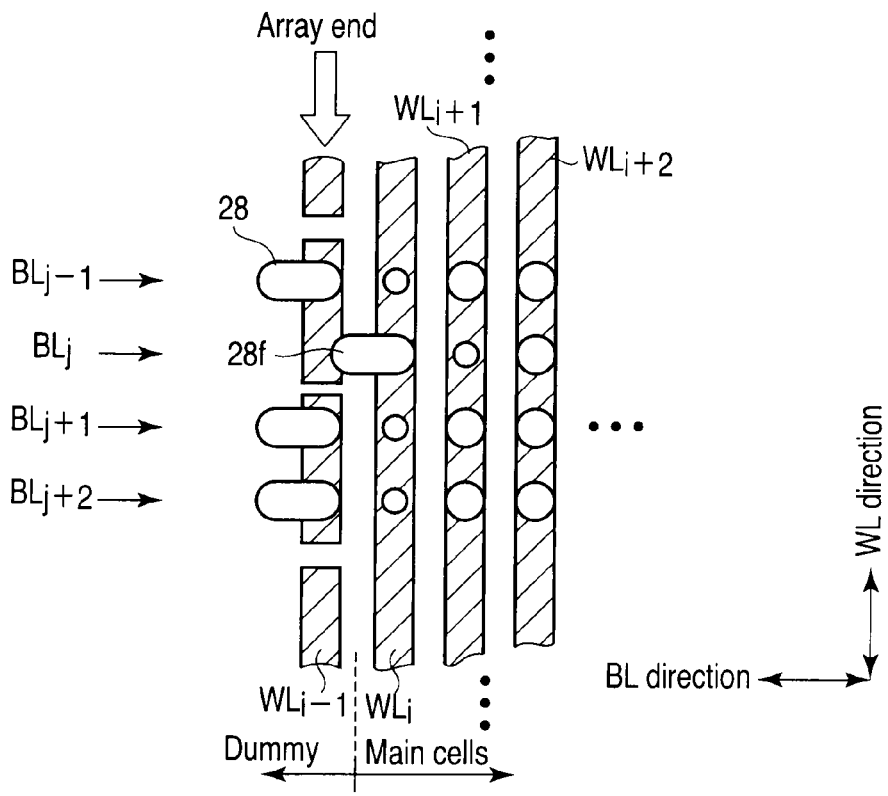
FIG. 14 is a diagram schematically showing part of the pattern transfer process using the structure of FIG. 12.

Now, the basic configuration of the phase-change memory device according to the first embodiment is roughly described with FIGS. 12, 13 and 14.

FIG. 12 is a diagram schematically showing the configuration of interconnects of the phase-change memory device according to the first embodiment. FIGS. 13 and 14 are diagrams schematically showing part of the pattern transfer process using the structure of FIG. 12.

As shown in FIG. 12, memory cell structures 28 are formed by the lithography process, for example, at the intersections (broken line portions in the diagram) of word lines (WLi−1, WLi, WLi+1, WLi+2) and the bit lines (BLj−1, BLj, BLj+1, BLj+2) as shown in FIG. 5. Outermost (array endmost) word line WLi−1 has a discontinuous broken line configuration that electrically separates the memory cell structures 28 into groups of two. Moreover, outermost word line WLi−1 is a dummy word line, and the memory cell structures 28 formed on word line WLi−1 are treated as dummy memory cell structures.

In addition, a cell array is enclosed by an extraction region.

Now, a case is described with FIG. 13 in which some of the memory cell structures 28 are not formed on the array end (word line WLi−1) as in the above-described comparative example.

As shown in FIG. 13, a lithography process is carried out using the structure shown in FIG. 12 to form resist patterns 35 for forming the memory cell structures 28. In this case, no resist pattern 35 may be formed at a designed position (e.g., the intersection of word line WLi−1 and bit line BLj) because of, for example, underexposure in the lithography process, variability of pattern dimension on the photomask, or resist collapse after the resist formation.

Then, as shown in FIG. 14, when an RIE process to form the outermost memory cell structures 28 is carried out using the resist patterns 35 formed in FIG. 13, etching is performed so that reaction products are deposited on the side of the extraction region by the RIE. Thus, the outermost memory cell structures 28 extend toward the extraction region in lower parts. Moreover, the memory cell structure 28 adjacent to the outermost memory cell structure 28 in the bit line direction is reduced in width as compared with the resist pattern 35. Therefore, when memory cell structure is not formed at a designed position, a memory cell structure 28*f* formed at the intersection of word line WLi and bit line BLj extends toward the extraction region and comes in contact with word line WLi−1.

According to the first embodiment described above, outermost word line WLi−1 on the array end has a broken line configuration that electrically connects two memory cell structures 28 together. The memory cell structures 28 formed on outermost word line WLi−1 are dummy memory cell structures. In the lithography process, memory cell structure 28 may not be formed on outermost word line WLi−1 because of, for example, missing pattern. In this case, memory cell structure 28*f* formed on word line WLi adjacent to the region where memory cell structure 28 is not formed is the outermost memory cell. During processing, the amount of RIE reaction products deposited on the sidewall facing the extraction region is greater than the amount of RIE reaction products deposited on the sidewall facing the inside of the memory cell array. Therefore, the outermost memory cell structure 28 extends toward the extraction region as the processing goes further. As a result, memory cell structure 28*f* formed at the intersection of word line WLi and bit line BLj is electrically connected to word line WLi−1. In this case, the memory cell structures 28 that cause operation failure can be minimized because outermost word line WLi−1 has a broken line configuration. That is, there are only two memory cell structures that cause operation failure: the memory cell structure 28 formed at the intersection of word line WLi and bit line BLj−1, and memory cell structure 28*f* formed at the intersection of word line WLi and bit line BLj.

Thus, the number of defective cells that do not function normally can be minimized. Even when the phase-change memory device is miniaturized, a sufficient active cell array region can be ensured.

Now, a basic method of manufacturing the phase-change memory device according to the first embodiment is roughly described with FIGS. 15A, 15B, 16A, 16B, 17A, 17B, 18A, 18B, 19A, 19B, 20A, 20B, 21A, 21B, 22A, 22B, 23A, 23B, 24A and 24B.

FIGS. 15A 16A, 17A, 18A, 19A, 20A, 21A, 22A, 23A and 24A are sectional view along the bit line direction schematically showing the basic method of manufacturing the phase-change memory device according to the first embodiment. FIGS. 15B 16B, 17B, 18B, 19B, 20B, 21B, 22B, 23B and 24B are sectional view along the word line direction schematically showing the basic method of manufacturing the phase-change memory device according to the first embodiment.

Figures 15A, 15B:
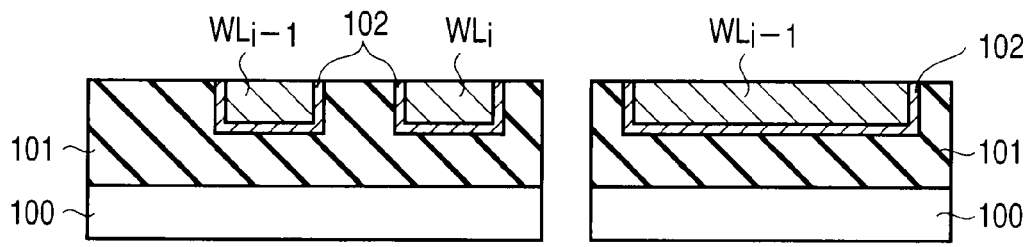
FIG. 15A is a sectional view along a bit line direction schematically showing a basic method of manufacturing the phase-change memory device according to the first embodiment.
FIG. 15B is a sectional view along a word line direction schematically showing the basic method of manufacturing the phase-change memory device according to the first embodiment.

As shown in FIGS. 15A and 15B, a silicon oxide film 101 having a thickness of about 400 nm is formed on a semiconductor substrate (silicon substrate) 100. Then, part of the silicon oxide film 101 is removed using a patterned resist (not shown) as a mask. Then, TiN, for example, is formed into a film as a barrier metal film 102, and tungsten, for example, to serve as word lines WLi−1, WLi, . . . is formed into a film by sputtering. Further, the extra tungsten film and barrier metal film 102 are removed by chemical mechanical polishing (CMP) using the silicon oxide film 101 as a stop film.

As shown in FIGS. 16A and 16B, TiN, for example, is formed into a film as a barrier metal film 103 about several nanometers thick to serve as the barrier metal layer 30 (see FIG. 4), and, for example, an amorphous silicon layer 104 about 50 nm thick doped with a donor-type impurity is formed.

As shown in FIGS. 17A and 17B, a non-doped amorphous silicon layer 105 about 100 nm thick is formed.

As shown in FIGS. 18A and 18B, an amorphous silicon layer 106 about 50 nm thick doped with an acceptor-type impurity is formed.

As shown in FIGS. 19A and 19B, TiN, for example, is formed into a film as a barrier metal film 107 about several nanometers thick to serve as the lower electrode 31. Subsequently, a resistance-change layer 108, for example, an HfO film about 10 nm thick to serve as a memory cell (variable resistive element) 26 of a ReRAM is formed. Another material for the resistance-change layer 108 is, for example, NiO. Further, a barrier metal film 109 about several nanometers thick to serve as the upper electrode 32 is formed.

As shown in FIGS. 20A and 20B, W about 100 nm thick is formed as an electrode contact layer 110. A mask material layer 111 is formed. This mask material layer 111 has a stack structure including, for example, a silicon oxide film.

Figures 21A, 21B:
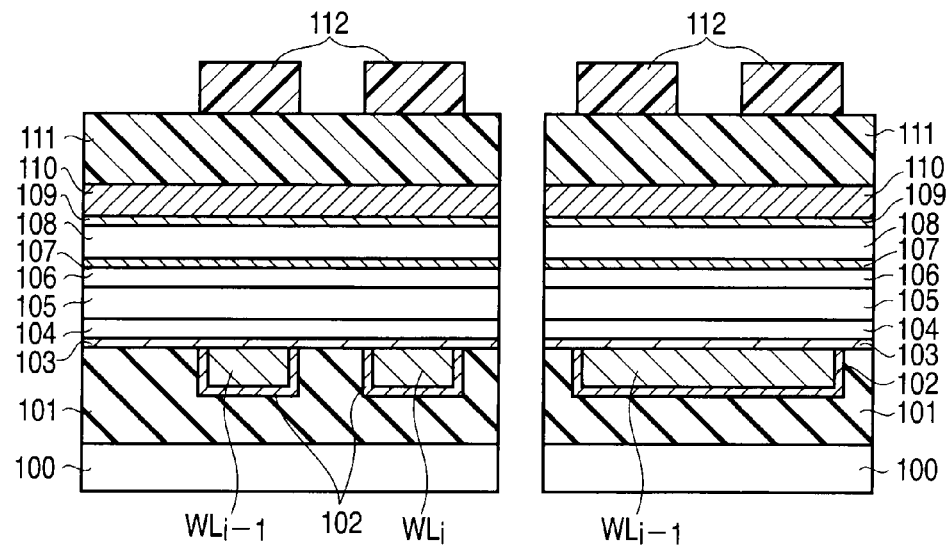
FIG. 21A is a sectional view along the bit line direction schematically showing the basic method of manufacturing the phase-change memory device according to the first embodiment.
FIG. 21B is a sectional view along the word line direction schematically showing the basic method of manufacturing the phase-change memory device according to the first embodiment.

As shown in FIGS. 21A and 21B, a patterned resist 112 is formed. This resist 112 is used to pattern the mask material layer 111.

Figures 22A, 22B:
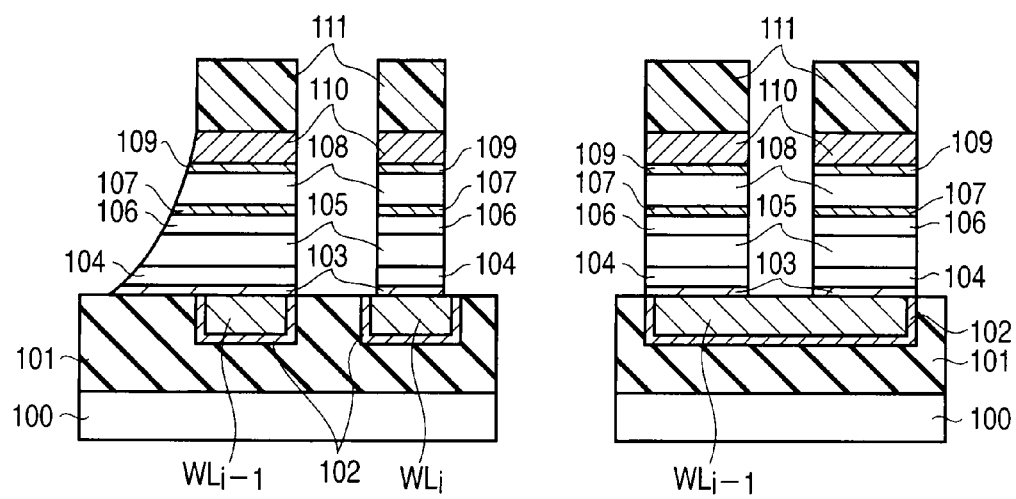
FIG. 22A is a sectional view along the bit line direction schematically showing the basic method of manufacturing the phase-change memory device according to the first embodiment.
FIG. 22B is a sectional view along the word line direction schematically showing the basic method of manufacturing the phase-change memory device according to the first embodiment.

As shown in FIGS. 22A and 22B, the patterned mask material layer is used as a mask to etch, in accordance with the RIE method, the electrode contact layer 110, the barrier metal film 109, the resistance-change layer 108, the barrier metal film 107, amorphous silicon layer 106, amorphous silicon layer 105, amorphous silicon layer 104 and the barrier metal film 103. As a result, a memory cell structure 28 (see FIG. 4) is formed.

In this case, in the outermost memory cell structure, there is a process conversion difference between the side facing the extraction region and the side facing the inside of the memory cell array. As a result, in the outermost memory cell structure and in the memory cell structure adjacent to the outermost memory cell structure, the pattern of the resist 112 may not be precisely transferred. More specifically, during etching by the RIE, more etching reaction products stick to the outermost memory cell structure especially in the extraction region direction. Thus, the memory cell structure extends in an array end direction in the lower part. Moreover, the pattern of the memory cell structure adjacent to the outermost memory cell structure is smaller in width than the pattern of the resist 112. This is attributed to the fact that the patterns are scattered and a lot of reaction products are generated because of a larger etching area in the extraction region and that, on the other hand, patterns are dense and a few of etching reaction products are generated in the memory array.

As shown in FIGS. 23A and 23B, a silicon oxide film 113 is formed all over to fill the spaces between the memory cells. CMP is carried out before the surface of the electrode contact layer 110 is exposed.

As shown in FIGS. 24A and 24B, a conductive film for the bit lines is formed. The patterned resist is used to form patterns of bit lines BLj−1, BLj, . . . . . Thus, the memory cell structure 28 constituted of the barrier metal layer 30, the diode 27, the lower electrode 31, the memory cell 26, the upper electrode 32 and the electrode contact layer 110 is formed.

Second Embodiment

The basic configuration of a phase-change memory device according to a second embodiment is described with FIGS. 25, 26 and 27.

In the first embodiment described above, word line WLi−1 which is the interconnect at the end of the cell array has a broken line configuration that electrically connects two memory cell structures 28 together. In the second embodiment described below, a word line WLi−1 at the end of a cell array has a broken line configuration that electrically connects three memory cell structures 28 together.

FIG. 25 is a diagram schematically showing the configuration of interconnects of the phase-change memory device according to the second embodiment. FIGS. 26 and 27 are diagrams schematically showing part of the pattern transfer process using the structure of FIG. 25.

As shown in FIG. 25, the memory cell structures 28 are formed by the lithography process, for example, at the intersections (broken line portions in the diagram) of word lines (WLi−1, WLi, WLi+1, WLi+2) and the bit lines (BLj−1, BLj, BLj+1, BLj+2) as shown in FIG. 5. Outermost word line WLi−1 has a discontinuous broken line configuration that electrically separates the memory cell structures 28 into groups of three. Moreover, outermost word line WLi−1 is a dummy word line, and the memory cell structures 28 formed on word line WLi−1 are treated as dummy memory cell structures.

In addition, a cell array is enclosed by an extraction region.

Now, a case is described with FIG. 26 in which some of the memory cell structures 28 are not formed on the array end (word line WLi−1) as in the above-described comparative example.

As shown in FIG. 26, a lithography process is carried out using the structure shown in FIG. 25 to form resist patterns 35 for forming the memory cell structures 28. In this case, resist pattern 35 may not be formed at a designed position (e.g., the intersection of word line WLi−1 and bit line BLj) because of, for example, underexposure in the lithographic process, variability of pattern dimension on the photomask, or resist collapse after the resist formation.

Then, as shown in FIG. 27, when an RIE process to form the outermost memory cell structures 28 is carried out using the resist patterns 35 formed in FIG. 26, the outermost memory cell structures 28 extend toward the extraction region in lower parts as in the first embodiment described above. Moreover, the memory cell structure 28 adjacent to the outermost memory cell structure 28 in the bit line direction is reduced in width as compared with the resist pattern 35. Therefore, when memory cell structure is not formed at a designed position, a memory cell structure 28f formed at the intersection of word line WLi and bit line BLj extends toward the extraction region and comes in contact with word line WLi−1.

According to the second embodiment described above, outermost word line WLi−1 on the array end has a broken line configuration that electrically connects three memory cell structures 28 together. The memory cell structures 28 formed on outermost word line WLi−1 are dummy memory cell structures. In the lithography process, memory cell structure 28 may not be formed on outermost word line WLi−1 because of, for example, missing lithography. In this case, memory cell structure 28f formed on the word line WL adjacent to the region where the outermost memory cell structure 28 is not formed is the outermost memory cell. During processing, the amount of RIE reaction products deposited on the sidewall facing the extraction region is greater than the amount of RIE reaction products deposited on the sidewall facing the inside of the memory cell array. Therefore, the outermost memory cell structure 28 extends toward the extraction region as the processing goes further. As a result, memory cell structure 28f formed at the intersection of word line WLi and bit line BLj is electrically connected to word line WLi−1. In this case, since outermost word line WLi−1 has a broken line configuration, there are only three memory cell structures 28 that cause operation failure: the memory cell structure 28 formed at the intersection of word line WLi and bit line BLj−1, memory cell structure 28f formed at the intersection of word line WLi and bit line BLj, and the memory cell structure 28 formed at the intersection of word line WLi and bit line BLj+1.

Thus, as in the first embodiment described above, the number of memory cells that cause operation failure can be reduced, and the number of dummy memory cell structures 28 can also be reduced. Therefore, even when the phase-change memory device is miniaturized, a sufficient active cell array region can be ensured.

Furthermore, according to the second embodiment described above, outermost word line WLi−1 is structured to separate the memory cell structures 28 into groups of three. Then, the outermost word line WLi−1 can be large compared to first embodiment. Thus, outermost word line WLi−1 can be easily formed.

Third Embodiment

The basic configuration of a phase-change memory device according to a third embodiment is described with FIGS. 28, 29 and 30.

In the first embodiment described above, word line WLi−1 which is the interconnect at the end of the cell array has a broken line configuration that electrically connects two memory cell structures 28 together. In the third embodiment described below, a word line WLi−1 at the end of a cell array and a word line WLi are in a broken line configuration that electrically connects two memory cell structures 28 together.

FIG. 28 is a diagram schematically showing the configuration of interconnects of the phase-change memory device according to the third embodiment. FIGS. 29 and 30 are diagrams schematically showing part of the pattern transfer process using the structure of FIG. 28.

As shown in FIG. 28, the memory cell structures 28 are formed by the lithography process, for example, at the intersections (broken line portions in the diagram) of word lines (WLi−1, WLi, WLi+1, WLi+2) and the bit lines (BLj−1, BLj, BLj+1, BLj+2) as shown in FIG. 5. Outermost word line WLi−1 and word line WLi adjacent to word line WLi−1 are in a discontinuous broken line configuration that electrically separates the memory cell structures 28 into groups of two. The separation points alternate in the BL direction. Specifically, a separation point of the WLi−1 is located halfway between separation points of the Wli in the BL direction. Moreover, outermost word line WLi−1 and word line WLi are dummy word lines, and the memory cell structures 28 formed on word line WLi−1 and word line WLi are treated as dummy memory cell structures.

In addition, a cell array is enclosed by an extraction region.

Now, a case is described with FIG. 29 in which some of the memory cell structures 28 are not formed on word line WLi−1 and word line WLi.

As shown in FIG. 29, a lithography process is carried out using the structure shown in FIG. 28 to form resist patterns 35 for forming the memory cell structures 28. In this case, the resist patterns 35 may not be formed at designed positions (e.g., the intersection of word line WLi−1 and bit line BLj and the intersection of word line WLi and bit line BLj) because of, for example, underexposure in the lithographic process, variability of pattern dimension on the photomask, or resist collapse after the resist formation.

Then, as shown in FIG. 30, when an RIE process to form the outermost memory cell structures 28 is carried out using the resist patterns 35, the outermost memory cell structures 28 extend toward the extraction region in lower parts as in the embodiments described above. Moreover, the memory cell structure 28 adjacent to the outermost memory cell structure 28 in the bit line direction is reduced in width as compared with the resist pattern 35. Therefore, when memory cell structure 28 is not formed at a designed position, a memory cell structure 28f formed at the intersection of word line WLi+1 and bit line BLj extends toward the extraction region and comes in contact with word line WLi.

According to the third embodiment described above, outermost word line WLi-1 on the array end and word line WLi are in a broken line configuration that electrically connects two memory cell structures 28 together. The memory cell structures 28 formed on outermost word line WLi-1 and word line WLi are dummy memory cell structures. In the lithography process, no memory cell structure 28 may be formed on outermost word line WLi-1 and word line WLi because of, for example, missing lithography. In this case, memory cell structure 28f formed on word line WLi adjacent to the region where the outermost memory cell structure 28 is not formed is the outermost memory cell. During processing, the amount of RIE reaction products deposited on the sidewall facing the extraction region is greater than the amount of RIE reaction products deposited on the sidewall facing the inside of the memory cell array. Therefore, the outermost memory cell structure 28 extends toward the extraction region as the processing goes further. As a result, the memory cell structure 28 formed at the intersection of word line WLi+1 and bit line BLj is electrically connected to word line WLi. In this case, since word line WLi has a broken line configuration, there are only two memory cell structures 28 that cause operation failure: memory cell structure 28f formed at the intersection of word line WLi+1 and bit line BLj, and the memory cell structure 28 formed at the intersection of word line WLi+1 and bit line BLj+1.

Thus, as in the embodiments described above, the number of memory cells that cause operation failure can be reduced. Therefore, even when the phase-change memory device is miniaturized, a sufficient active cell array region can be ensured.

Furthermore, according to the third embodiment described above, two dummy word lines WL are provided in order from the array end. This allows for a greater processing margin for problems such as underexposure in the lithography process, variability of pattern dimension on the photomask, and resist collapse after the resist formation.

Fourth Embodiment

Figure 33:
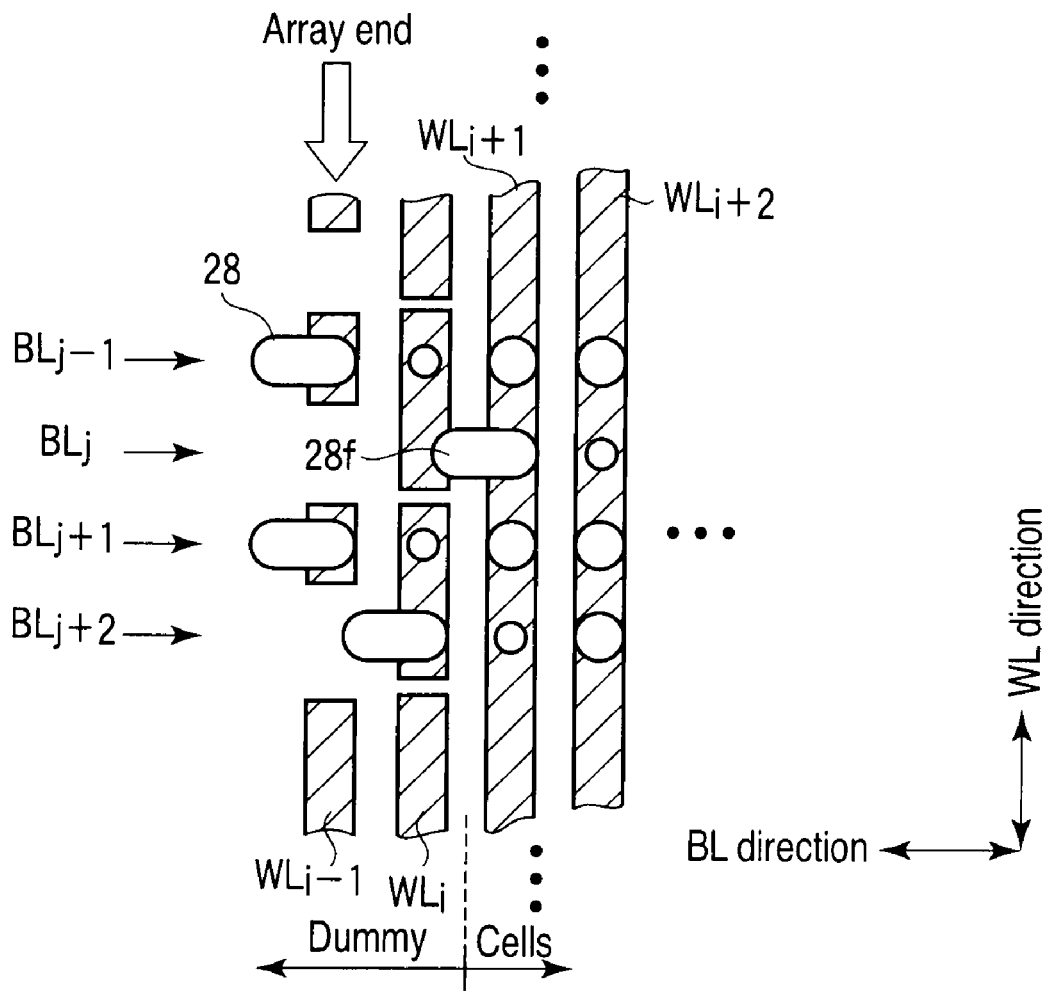
FIG. 33 is a diagram schematically showing part of the pattern transfer process using the structure of FIG. 31.

The basic configuration of a phase-change memory device according to a fourth embodiment is described with FIGS. 31, 32 and 33.

In the third embodiment described above, word line WLi-1 at the end of the cell array and word line WLi are in a broken line configuration that electrically connects two memory cell structures 28 together. In the fourth embodiment described below, the outermost memory cell structures 28 are formed every other bit line in the WL direction, outermost word line WLi-1 is formed immediately under at least these memory cell structures 28, and word line WLi-1 is electrically discontinuous.

FIG. 31 is a diagram schematically showing the configuration of interconnects of the phase-change memory device according to the fourth embodiment. FIGS. 32 and 33 are diagrams schematically showing part of the pattern transfer process using the structure of FIG. 31.

As shown in FIG. 31, the memory cell structures 28 are formed by the lithography process, for example, at the intersections (broken line portions in the diagram) of word lines (WLi-1, WLi, WLi+1, WLi+2) and the bit lines (BLj-1, BLj, BLj+1, BLj+2) as shown in FIG. 5. The outermost memory cell structures 28 are formed every other bit line in the WL direction. Outermost word line WLi-1 is formed immediately under at least the outermost memory cell structures 28, and word line WLi-1 is electrically discontinuous. More specifically, the outermost memory cell structures 28 are formed at the intersections of word line Wli-1 and bit lines BLj-1, BLj+1, . . . (every other bit line BL). Word line WLi adjacent to outermost word line WLi-1 has a discontinuous broken line configuration that electrically separates the memory cell structures 28 into groups of two. Moreover, outermost word line WLi-1 and word line WLi are dummy word lines, and the memory cell structures 28 formed on word line WLi-1 and word line WLi are dummy memory cell structures.

In addition, a cell array is enclosed by an extraction region.

Moreover, word line WLi-1 is formed immediately under at least the outermost memory cell structures 28, and word line WLi-1 may be in any configuration as long as it is electrically discontinuous.

Now, a case is described with FIG. 32 in which some of the memory cell structures 28 are not formed on word line WLi.

As shown in FIG. 32, a lithography process is carried out using the structure shown in FIG. 31 to form resist patterns 35 for forming the memory cell structures 28. In this case, resist pattern 35 may not be formed at a designed position (e.g., the intersection of word line WLi and bit line BLj) because of, for example, underexposure in the lithographic process, variability of pattern dimension on the photomask, or resist collapse after the resist formation.

Then, as shown in FIG. 33, when an RIE process to form the outermost memory cell structures 28 is carried out using the resist patterns 35, the outermost memory cell structures 28 extend toward the extraction region in lower parts as in the embodiments described above. Moreover, the memory cell structure 28 adjacent to the outermost memory cell structure 28 in the bit line direction is reduced in width as compared with the resist pattern 35. Therefore, when memory cell structure 28 is not formed at a designed position, a memory cell structure 28f formed at the intersection of word line WLi+1 and bit line BLj extends toward the extraction region and comes in contact with word line WLi.

According to the fourth embodiment described above, the outermost memory cell structures 28 are formed every other bit line, outermost word line WLi-1 is formed immediately under at least these memory cell structures 28, and word line WLi-1 is electrically discontinuous. Outermost word line WLi has a broken line configuration that electrically connects two memory cell structures 28 together. Moreover, the memory cell structures 28 formed on outermost word line WLi-1 and word line WLi are dummy memory cell structures. In the lithography process, memory cell structure 28 may not be formed on word line WLi because of, for example, missing lithography. In this case, the memory cell structure 28 formed on word line WLi adjacent to the region where the outermost memory cell structure 28 is not formed is the outermost memory cell. During processing, the amount of RIE reaction products deposited on the sidewall facing the extraction region is greater than the amount of RIE reaction products deposited on the sidewall facing the inside of the memory cell array. Therefore, the outermost memory cell structure 28 extends toward the extraction region as the processing goes further. As a result, memory cell structure 28f formed at the intersection of word line WLi+1 and bit line BLj is electrically connected to word line WLi. In this case, since word line WLi has a broken line configuration, there are only two memory cell structures 28 that cause operation failure: memory cell structure 28f formed at the intersection of word line WLi+1 and bit line BLj, and the memory cell structure 28 formed at the intersection of word line WLi+1 and bit line BLj+1.

Thus, as in the embodiments described above, the number of memory cells that cause operation failure can be reduced. Therefore, even when the phase-change memory device is miniaturized, a sufficient active cell array region can be ensured.

Furthermore, according to the fourth embodiment described above, the outermost memory cell structures 28 are formed every other bit line BL. Moreover, outermost word line WLi−1 is formed immediately under at least the outermost memory cell structures 28, and word line WLi−1 may be in any configuration as long as it is electrically discontinuous. This improves the degree of freedom in the interconnect layout at the end of the cell array 25. Further, as in the third embodiment described above, two dummy word lines WL are provided in order from the array end. This allows for a greater margin for problems such as underexposure in the lithography process, variability of pattern dimension on the photomask, and resist collapse after the resist formation. Thus, the number of memory cells that cause operation failure can be easily reduced.

In the embodiments described above, several ways have been shown to separate the dummy word line WL. However, the dummy word line WL may be configured in any form as long as it is electrically discontinuous. For example, the word line WL has only to be configured so that it is electrically disconnected in at least one part.

Furthermore, in the embodiments described above, the outermost word line WL or the word line adjacent to the outermost word line WL (second word line from the outermost word line) is used as the dummy word line WL. However, a desired number of word lines may be used as dummy interconnects and memory cell structures.

Still further, in the structure according to the embodiments described above, the word line WL, the diode 27, the variable resistive element 26 and the bit line BL are stacked in order from the lower side. However, a similar embodiment can be applied in the case of a structure in which the bit line BL, the diode 27, the variable resistive element 26 and the word line WL are stacked in order from the lower side, in the case of a structure in which the word line WL, the variable resistive element 26, the diode 27 and the bit line BL are stacked in order from the lower side, or in the case of a structure in which the bit line BL, the variable resistive element 26, the diode 27 and the word line WL are stacked in order from the lower side.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a plurality of parallel first interconnects extending in a first direction;
    a plurality of parallel second interconnects which extend in a second direction perpendicular to the first direction and which make a two-level crossing with respect to the first interconnects; and
    memory cell structures provided in regions where the first interconnects and the second interconnects make two-level overlaps, the memory cell structures being connected on one end to the first interconnects and connected on the other end to the second interconnects, the memory cell structure including a variable resistive element and a non-ohmic element which are connected in series;
    wherein the endmost first interconnect is disconnected in at least one portion.

2. The device according to claim 1, wherein at least one of the memory cell structures formed on another first interconnect adjacent to the endmost first interconnect is in contact with the endmost first interconnect.

3. The device according to claim 1, wherein the number of the memory cell structures provided on the endmost first interconnect is smaller than the number of the memory cell structures provided on another first interconnect.

4. The device according to claim 1, wherein the first interconnect is regularly disconnected.

5. The device according to claim 1, wherein the endmost first interconnect is disconnected every two memory cells.

6. The device according to claim 1, wherein the endmost first interconnect is disconnected every three memory cells.

7. The device according to claim 1,
    wherein the endmost first interconnect is a dummy interconnect.

8. The device according to claim 1, wherein a memory cell connected to the endmost first interconnect is a dummy cell.

9. The device according to claim 1, wherein another first interconnect adjacent to the endmost first interconnect is disconnected in at least one portion.

10. The device according to claim 9, wherein the number of the memory cell structures provided on the endmost first interconnect is smaller than the number of the memory cell structures provided on another first interconnect.

11. The device according to claim 9, wherein the another first interconnect adjacent to the endmost first interconnect is regularly disconnected.

12. The device according to claim 9, wherein at least one of the memory cell structures formed on still another first interconnect which is adjacent to the another first interconnect adjacent to the endmost first interconnect is in contact with the another first interconnect adjacent to the endmost first interconnect.

13. The device according to claim 9, wherein a disconnection part of the endmost first interconnect and a disconnection part of the another first interconnect alternate in the first direction.

14. The device according to claim 9, wherein a space between disconnected part of the endmost first interconnect is greater than a space between disconnected part of the another first interconnect adjacent to the endmost first interconnect.

15. The device according to claim 9, wherein the another first interconnect adjacent to the endmost first interconnect is disconnected every two memory cells.

16. The device according to claim 9, wherein the endmost first interconnect and the another first interconnect adjacent to the endmost first interconnect are dummy interconnects.

17. The device according to claim 9, wherein memory cells connected to the endmost first interconnect and the another first interconnect adjacent to the endmost first interconnect are dummy cells.

* * * * *